(12) United States Patent
Kang et al.

(10) Patent No.: US 12,713,912 B2
(45) Date of Patent: Aug. 18, 2026

(54) SEMICONDUCTOR PACKAGE

(71) Applicant: SAMSUNG ELECTRONICS CO., LTD., Suwon-si (KR)

(72) Inventors: Sunggu Kang, Suwon-si (KR); Jae Choon Kim, Suwon-si (KR); Sung-Ho Mun, Suwon-si (KR); Hwanjoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 369 days.

(21) Appl. No.: 18/379,286

(22) Filed: Oct. 12, 2023

(65) Prior Publication Data

US 2024/0321673 A1 Sep. 26, 2024

(30) Foreign Application Priority Data

Mar. 22, 2023 (KR) ........................ 10-2023-0037290

(51) Int. Cl.

*H10W 40/22* (2026.01)
*H10W 40/25* (2026.01)
*H10W 70/685* (2026.01)
*H10W 72/00* (2026.01)
*H10W 74/00* (2026.01)

(Continued)

(52) U.S. Cl.

CPC ......... *H10W 40/22* (2026.01); *H10W 40/251* (2026.01); *H10W 70/685* (2026.01); *H10W 74/016* (2026.01); *H10W 90/701* (2026.01); *H10W 72/877* (2026.01);

(Continued)

(58) Field of Classification Search

CPC ............. H01L 23/3128; H01L 23/3677; H01L 23/5389; H01L 23/29; H01L 23/3731; H01L 23/3736; H01L 23/5384; H01L 25/0652; H01L 25/0657; H01L 25/18; H10W 40/228; H10W 70/60; H10W 70/614; H10W 70/635; H10W 70/65; H10W 70/655; H10W 72/20; H10W 72/30; H10W 72/851; H10W 74/117; H10W 74/40; H10W 20/42; H10W 20/435; H10W 90/00

See application file for complete search history.

(56) References Cited

U.S. PATENT DOCUMENTS 7,601,561 B2 10/2009 Im et al.
8,536,958 B2 9/2013 Omura et al.

(Continued)

FOREIGN PATENT DOCUMENTS

KR 10-0714186 B1 5/2007

*Primary Examiner* — Steven B Gauthier
*Assistant Examiner* — Marc-Anthony Armand
(74) *Attorney, Agent, or Firm* — Sughrue Mion, PLLC

(57) ABSTRACT

A semiconductor package includes a redistribution layer structure, a semiconductor structure on the redistribution layer structure, at least one heat dissipation structure on the semiconductor structure, where the at least one heat dissipation structure may include a first epoxy molding compound, a molding material for molding the semiconductor structure and the at least one heat dissipation structure, on the redistribution layer structure, where the molding material may include a second epoxy molding compound, where the first epoxy molding compound may have higher thermal conductivity than the second epoxy molding compound.

20 Claims, 27 Drawing Sheets

(51) Int. Cl.
*H10W 74/01* (2026.01)
*H10W 90/00* (2026.01)

(52) U.S. Cl.
CPC .......... *H10W 74/00* (2026.01); *H10W 90/724* (2026.01); *H10W 90/732* (2026.01); *H10W 90/734* (2026.01)

(56) References Cited

U.S. PATENT DOCUMENTS

| | | | | |
|---|---|---|---|---|
| 9,842,799 | B2 | 12/2017 | Jang | |
| 9,865,570 | B1 | 1/2018 | England et al. | |
| 10,879,225 | B2 | 12/2020 | Kim et al. | |
| 11,348,857 | B2 | 5/2022 | Qu | |
| 2016/0013155 | A1* | 1/2016 | Chung | H01L 25/105 257/659 |
| 2019/0214328 | A1 | 7/2019 | Eid et al. | |
| 2021/0028146 | A1 | 1/2021 | Lee et al. | |
| 2021/0233829 | A1* | 7/2021 | Pei | H10W 40/228 |
| 2023/0411234 | A1* | 12/2023 | Yeh | H01L 23/3736 |
| 2023/0420331 | A1* | 12/2023 | Wu | H10W 40/228 |
| 2024/0128150 | A1* | 4/2024 | Tong | H01L 23/49822 |

* cited by examiner

SEMICONDUCTOR PACKAGE

CROSS-REFERENCE TO RELATED APPLICATION

This application claims priority to and the benefit of Korean Patent Application No. 10-2023-0037290 filed in the Korean Intellectual Property Office on Mar. 22, 2023, the entire contents of which are incorporated herein by reference.

BACKGROUND

(a) Field

The present disclosure relates to a semiconductor package.

(b) Description of the Related Art

The semiconductor industry field is pursuing improvement in integration density so that more passive or active devices may be integrated in a given area. However, in the semiconductor industry field, as technology development for miniaturizing a circuit line width in a front end semiconductor process gradually faces limitations, a semiconductor package that protects a semiconductor chip on which an integrated circuit is formed is becoming lightweight, thin, miniaturized, high-speed, and multifunctional, and there is a trend to supplement the limitations at the front end semiconductor process by developing a semiconductor package with high integrated density.

When the semiconductor package becomes lightweight, thin, miniaturized, high-speed, and multifunctional, power consumed per unit volume of the semiconductor package further increases and a temperature inside the semiconductor package increases. Particularly, in a Package-on-Package (POP) structure, a molding material and a back side redistribution (BRDL) structure are located on a three-dimensional integrated circuit (3D IC) structure, and accordingly, it is difficult to dissipate the heat generated from the three-dimensional integrated circuit (3D IC) structure in an upward direction. In addition, in a side-by-side package structure, although the upper semiconductor die of a three-dimensional integrated circuit (3D IC) structure is exposed, a lower semiconductor die is surrounded by a molding material having a low thermal conductivity, and therefore, it is difficult to dissipate the heat generated from the lower semiconductor die in the upward direction.

When heat generated in the semiconductor package is not efficiently discharged in response to the increase in temperature of the semiconductor package, a difference in thermal stress may occur in the package structure, which may cause warpage in the package and slow down an operation speed of the semiconductor package, thereby causing problems with product reliability.

Therefore, it is necessary to develop a new semiconductor package technology that may improve these thermal characteristics.

SUMMARY

In an embodiment, in order to improve thermal characteristics of a semiconductor package, an epoxy molding compound (EMC) material having high thermal conductivity may be disposed in an upper portion of a semiconductor structure. Specifically, the present disclosure attempts to provide a semiconductor package, in which at least one heat dissipation structure including a first epoxy molding compound is disposed on a semiconductor structure, and the semiconductor structure and at least one heat dissipation structure is molded by a molding material including a second epoxy molding compound, where the first epoxy molding compound has higher thermal conductivity than the second epoxy molding compound.

A semiconductor package includes a redistribution layer structure, a semiconductor structure on the redistribution layer structure, at least one heat dissipation structure on the semiconductor structure, where the at least one heat dissipation structure may include a first epoxy molding compound, a molding material molding the semiconductor structure and the at least one heat dissipation structure, and disposed on the redistribution layer structure, where the molding material may include a second epoxy molding compound, where the first epoxy molding compound may have higher thermal conductivity than the second epoxy molding compound.

A semiconductor package includes a redistribution layer structure, a first semiconductor structure on the redistribution layer structure, a second semiconductor structure disposed side by side with the first semiconductor structure on the redistribution layer structure, at least one heat dissipation structure on the first semiconductor structure, where the at least one heat dissipation structure may include a first epoxy molding compound, and a molding material molding the first semiconductor structure, the second semiconductor structure and the at least one heat dissipation structure, and disposed on the redistribution layer structure, where the molding material may include a second epoxy molding compound, where the first epoxy molding compound may have higher thermal conductivity than the second epoxy molding compound.

A semiconductor package includes a front side redistribution layer structure, a first semiconductor structure on the front side redistribution layer structure, at least one heat dissipation structure on the first semiconductor structure, where the at least one heat dissipation structure may include a first epoxy molding compound, a plurality of conductive posts electrically connected to the front side redistribution layer structure on the front side redistribution layer structure, a molding material molding the first semiconductor structure, the at least one heat dissipation structure, and the plurality of conductive posts, and disposed on the front side redistribution layer structure, where the molding material may include a second epoxy molding compound, a back side redistribution layer structure disposed on the plurality of conductive posts and the molding material, and electrically connected to the plurality of conductive posts, and a second semiconductor structure on the back side redistribution layer structure, where the first epoxy molding compound may have higher thermal conductivity than the second epoxy molding compound.

According to an embodiment, at least one heat dissipation structure including a first epoxy molding compound is disposed on a semiconductor structure, and the semiconductor structure and at least one heat dissipation structure is molded by a molding material including a second epoxy molding compound, where the first epoxy molding compound has higher thermal conductivity than the second epoxy molding compound. Accordingly, a heat dissipation path of the semiconductor structure in the upward direction may be secured.

According to an embodiment, a heat dissipation path of an asymmetric semiconductor structure in the upward direction may be secured by disposing at least one heat dissipation structure including various types of epoxy molding compounds on a semiconductor structure.

BRIEF DESCRIPTION OF THE DRAWINGS

FIG. 1 is a cross-sectional view of a plan view of a semiconductor package shown in FIG. 2 taken along line B-B'.

FIG. 2 is a top plan view of a cross-sectional view of a semiconductor package shown in FIG. 1 taken along line A-A'.

FIG. 3 is a cross-sectional view of a plan view of a semiconductor package shown in FIG. 4 taken along line B-B'.

FIG. 4 is a top plan view of a cross-sectional view of a semiconductor package shown in FIG. 3 taken along line A-A'.

FIG. 5 is a top plan view of a cross-sectional view of a semiconductor package shown in FIG. 3 taken along line A-A' according to another embodiment.

FIG. 6 is a cross-sectional view of a plan view of a semiconductor package shown in FIG. 7 taken along line B-B'.

FIG. 7 is a top plan view of a cross-sectional view of a semiconductor package shown in FIG. 6 taken along line A-A'.

FIG. 6 is a cross-sectional view of a plan view of a semiconductor package shown in FIG. 7 taken along line B-B'.

FIG. 9 is a top plan view of a cross-sectional view of a semiconductor package shown in FIG. 8 taken along line A-A'.

FIG. 10 is a cross-sectional view of an example embodiment showing a semiconductor package in which in which heat dissipation structures having an elongated shape are disposed on a fourth semiconductor die. FIG. 10 is a cross-sectional view of a plan view of a semiconductor package shown in FIG. 11 taken along line B-B'.

FIG. 11 is a top plan view of an example embodiment showing a semiconductor package in which conductive posts and heat dissipation structures on a fourth semiconductor die are disposed within a molding material. FIG. 11 is a top plan view of a cross-sectional view of a semiconductor package shown in FIG. 10 taken along line A-A'.

FIG. 12 is a cross-sectional view of an example embodiment showing a semiconductor package in which in which a heat dissipation structure having a plate shape is disposed on a fourth semiconductor die. FIG. 12 is a cross-sectional view of a plan view of a semiconductor package shown in FIG. 13 taken along line B-B'.

FIG. 13 is a top plan view of an example embodiment showing a semiconductor package in which a heat dissipation structure on a fourth semiconductor die, and conductive posts are disposed within a molding material. FIG. 13 is a top plan view of a cross-sectional view of a semiconductor package shown in FIG. 12 taken along line A-A'.

FIG. 14 is a cross-sectional view of a plan view of a semiconductor package shown in FIG. 15 taken along line B-B'.

FIG. 15 is a top plan view of a cross-sectional view of a semiconductor package shown in FIG. 14 taken along line A-A'.

FIG. 16 is a cross-sectional view of a plan view of a semiconductor package shown in FIG. 17 taken along line B-B'.

FIG. 17 is a top plan view of a cross-sectional view of a semiconductor package shown in FIG. 16 taken along line A-A'.

DETAILED DESCRIPTION OF THE EMBODIMENTS

Figure 1:
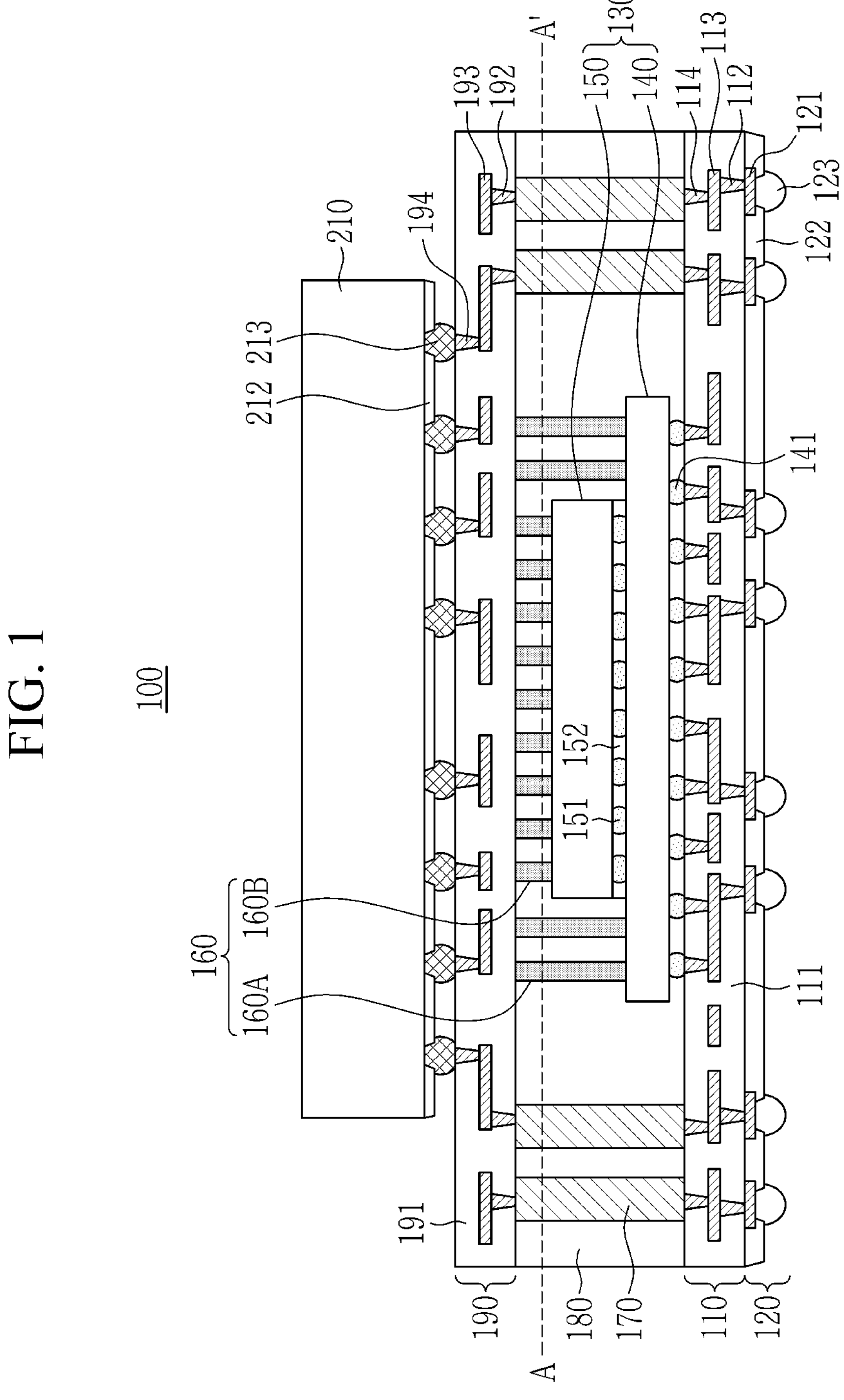
FIG. 1 is a cross-sectional view of an example embodiment showing a semiconductor package in which first heat dissipation structures having an elongated shape is disposed on a first semiconductor die of a three-dimensional integrated circuit structure, and second heat dissipation structures having an elongated shape is disposed on a second semiconductor die of a three-dimensional integrated circuit structure.

Embodiments will be described more fully hereinafter with reference to the accompanying drawings. As those skilled in the art would realize, the described embodiments may be modified in various different ways, all without departing from the spirit or scope of the embodiments.

The drawings and description are to be regarded as illustrative in nature and not restrictive. Like reference numerals designate like elements throughout the specification.

Further, in the drawings, the size and thickness of each element are arbitrarily illustrated for ease of description, and the present disclosure is not necessarily limited to those illustrated in the drawings.

Throughout this specification and the claims that follow, when it is described that an element is "coupled or connected" to another element, the element may be "directly coupled or connected" to the other element or "indirectly coupled or connected" to the other element through a third element. In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a semiconductor package and a manufacturing method of a semiconductor package according to an embodiment is describe with reference to the drawings.

FIG. 1 is a cross-sectional view showing a semiconductor package 100 in which first heat dissipation structures 160A of an elongated shape is disposed on a first semiconductor die 140 of a three-dimensional integrated circuit (3D IC) structure 130, and second heat dissipation structures 160B of the elongated shape is disposed on a second semiconductor die 150 of the three-dimensional integrated circuit (3D IC) structure 130. FIG. 1 is a cross-sectional view of a plan view of the semiconductor package 100 shown in FIG. 2 taken along line B-B'.

Referring to FIG. 1, the semiconductor package 100 may include a front side redistribution layer structure 110, an external connection structure 120, the three-dimensional integrated circuit (3D IC) structure 130 including the first semiconductor die 140 and the second semiconductor die 150, the heat dissipation structures 160, conductive posts 170, a molding material 180, a back side redistribution layer structure 190 and semiconductor structure (third semiconductor die) 210.

In an embodiment, the semiconductor package 100 may include a Package-on-Package (POP). In an embodiment, the semiconductor package 100 may include a fan-out wafer level package (FOWLP) or a fan-out panel level package (FOPLP).

The front side redistribution layer structure 110 may include a first dielectric layer 111, and first redistribution vias 112, first redistribution lines 113, and second redistribution vias 114 in the first dielectric layer 111. In another embodiment, a redistribution layer structure including a larger or smaller number of redistribution lines and redistribution vias are included in the scope of the present disclosure.

The first dielectric layer 111 protects and insulates the first redistribution vias 112, the first redistribution lines 113 and the second redistribution vias 114. The three-dimensional integrated circuit (3D IC) structure 130 including the first semiconductor die 140 and the second semiconductor die 150, and the conductive posts 170 may be disposed on an upper surface of the first dielectric layer 111. The external connection structure 120 may be disposed on a bottom surface of the first dielectric layer 111.

A first redistribution via 112 may be disposed between a first redistribution line 113 and a conductive pad 121 of the external connection structure 120. The first redistribution via 112 may electrically connect the first redistribution line 113 and the conductive pad 121 in a vertical direction. The first redistribution line 113 may be disposed between the first redistribution via 112 and a second redistribution via 114. The first redistribution line 113 may electrically connect the first redistribution via 112 and the second redistribution via 114 in a horizontal direction. The second redistribution via 114 may be disposed between the first redistribution line 113 and the conductive post 170. The second redistribution via 114 may electrically connect the first redistribution line 113 and the conductive post 170 in the vertical direction.

The external connection structure 120 may be disposed on a bottom surface of the front side redistribution layer structure 110. The external connection structure 120 may include a conductive pads 121, an insulation layer 122, and external connection members 123. The conductive pad 121 may electrically connect an external connection member 123 and the first redistribution via 112 of the front side redistribution layer structure 110. The insulation layer 122 may include a plurality of openings for soldering. The insulation layer 122 prevents the external connection member 123 from being short-circuited. The external connection member 123 may electrically connect the semiconductor package 100 to an external device.

The three-dimensional integrated circuit (3D IC) structure 130 may be disposed on an upper surface of the front side redistribution layer structure 110. The three-dimensional integrated circuit (3D IC) structure 130 may include the first semiconductor die 140 and the second semiconductor die 150. In an embodiment, the three-dimensional integrated circuit (3D IC) structure 130 may include a system-on-chip (SOC).

The first semiconductor die 140 may be disposed on the upper surface of the front side redistribution layer structure 110. In an embodiment, the first semiconductor die 140 may include a central processing unit (CPU) or graphic processing unit (GPU). The first semiconductor die 140 includes a connection member 141, and may be electrically connected to the second redistribution via 114 of the front side redistribution layer structure 110 through the connection member 141. In an embodiment, the connection member 141 may include a micro-bump.

In the three-dimensional integrated circuit (3D IC) structure 130 including the first semiconductor die 140 and the second semiconductor die 150 on the first semiconductor die 140, because the second semiconductor die 150 is disposed apart from the front side redistribution layer structure 110 that sends signal and power, by disposing a through-silicon via (TSV; not shown) within the first semiconductor die 140 and connecting the through-silicon via (TSV; not shown) to the second semiconductor die 150, thereby the speed of receiving and responding to signal and power of the second semiconductor die 150 may be increased.

The second semiconductor die 150 may be disposed on an upper surface of the first semiconductor die 140. In an embodiment, the second semiconductor die 150 may include a communication chip or sensor. The second semiconductor die 150 includes a connection member 151, and may be electrically connected to the first semiconductor die 140 through the connection member 151. In an embodiment, the connection member 151 may include a micro-bump. An insulation member 152 surrounds and insulates the connection member 151 between the first semiconductor die 140 and the second semiconductor die 150.

In order to promote electrical or mechanical stability by protecting the semiconductor chip from an external environment, the semiconductor chip may be molded by using a molding material in the process of manufacturing a semiconductor package. A typical molding material used in a semiconductor package is an epoxy molding compound (EMC), which is a thermosetting resin. In general, epoxy molding compound (EMC) has a low thermal conductivity smaller than or equal to 1 W/mK. As such, when a semiconductor chip is molded with an epoxy molding compound (EMC) having low thermal conductivity, it is difficult to dissipate heat generated from the semiconductor chip, which may cause problems in performance and reliability of the semiconductor package. Particularly, in the Package-on-Package (POP) structure, since not only the molding material but also back side redistribution (BRDL) structure are positioned on the three-dimensional integrated circuit (3D IC) structure, it is difficult to dissipate heat generated from the three-dimensional integrated circuit (3D IC) structure in an upward direction, which may cause problems of deteriorating performance and reliability of the semiconductor package. Therefore, in order to dissipate heat generated from the three-dimensional integrated circuit (3D IC) structure in the upward direction, heat dissipation structure may be disposed on the three-dimensional integrated circuit (3D IC) structure.

A heat dissipation structure 160 may include the first heat dissipation structures 160A disposed on the first semiconductor die 140 and a second heat dissipation structure 160B disposed on the second semiconductor die 150. The first heat dissipation structures 160A may include the elongated shape in the vertical direction. A side surface of the first heat dissipation structures 160A may be surrounded by the molding material 180. The second heat dissipation structures 160B may include the elongated shape in the vertical direction. A side surface of the second heat dissipation structures 160B may be surrounded by the molding material 180.

The first heat dissipation structures 160A may be disposed on the first semiconductor die 140, to dissipate heat generated from the first semiconductor die 140. In the first semiconductor die 140 located at a lower portion of the three-dimensional integrated circuit (3D IC) structure 130, heat may be accumulated in an edge portion in contact with the molding material 180 rather than a central portion. Therefore, the first heat dissipation structures 160A may be located on the edge portion of the first semiconductor die 140, to dissipate heat accumulated in the first semiconductor die 140.

One end of a first heat dissipation structure 160A may be in physical contact with the upper surface of the first semiconductor die 140, and the other end of first heat dissipation structure 160A may be in contact with a bottom surface of a dielectric layer 191 of the back side redistribution layer structure 190. Accordingly, heat accumulated in the first semiconductor die 140 may be conducted to one end of first heat dissipation structure 160A in physical contact with the first semiconductor die 140, and then via the first heat dissipation structure 160A, conducted to the back side redistribution layer structure 190, through the other end of first heat dissipation structure 160A in contact with a bottom surface of the dielectric layer 191 of the back side redistribution layer structure 190. A level of an upper surface of the first heat dissipation structure 160A may be the same as a level of an upper surface of the molding material 180.

The second heat dissipation structures 160B may be disposed on the second semiconductor die 150, to dissipate heat generated from the second semiconductor die 150. In the second semiconductor die 150 located at an upper portion of the three-dimensional integrated circuit (3D IC) structure 130, heat may be accumulated in a portion in contact with the molding material 180. Therefore, the second heat dissipation structures 160B may be located on the upper surface of the second semiconductor die 150, to dissipate heat accumulated in the second semiconductor die 150.

One end of second heat dissipation structure 160B may be in physical contact with the upper surface of the second semiconductor die 150, and the other end of second heat dissipation structure 160B may be in contact with the bottom surface of the dielectric layer 191 of the back side redistribution layer structure 190. Accordingly, heat accumulated in the second semiconductor die 150 may be conducted to the one end of second heat dissipation structure 160B in physical contact with the second semiconductor die 150, and then via the second heat dissipation structure 160B, conducted to the back side redistribution layer structure 190, through the other end of second heat dissipation structure 160B in contact with the bottom surface of the dielectric layer 191 of the back side redistribution layer structure 190. A level of an upper surface of the second heat dissipation structure 160B may be the same as the level of the upper surface of the molding material 180.

The first heat dissipation structures 160A and the second heat dissipation structures 160B may include a first epoxy molding compound (EMC), and the molding material 180 may include a second epoxy molding compound (EMC). In an embodiment, the first epoxy molding compound (EMC) may be a material in which a metal filler, a ceramic filler, or a carbon filler is included in the second epoxy molding compound (EMC). In another embodiment, the first epoxy molding compound (EMC) may be a material in which a metal filler, a ceramic filler, or a carbon filler is contained in another type of the epoxy molding compound (EMC). In an embodiment, the metal filler may include at least one of copper, nickel, silver, gold, and aluminum. In an embodiment, ceramic filler may include at least one of aluminum nitride (AlN), alumina ($Al_2O_3$), boron nitride (BN), beryllium oxide (BeO), and silicon carbide (SIC). In an embodiment, the carbon filler may include at least one of silicon carbide (SiC), graphite (Graphite), carbon nanotube, CNT, carbon fibers, and graphene.

By adding a metal filler, a ceramic filler, or a carbon filler to the second epoxy molding compound (EMC) or another type of the epoxy molding compound (EMC), and the first epoxy molding compound (EMC) with an adjusted coefficient of thermal expansion (CTE) and an enhanced thermal conductivity may be formed.

The first epoxy molding compound (EMC) may have high thermal conductivity than the second epoxy molding compound (EMC). A heat dissipation path may be formed by disposing the heat dissipation structures 160 made of the first epoxy molding compound (EMC) having higher thermal conductivity compared to the second epoxy molding compound (EMC) within the molding material 180 made of the second epoxy molding compound (EMC). In an embodiment, the first epoxy molding compound (EMC) may be thermal conductivity above about 1.0 W/mK. In an embodiment, the first epoxy molding compound (EMC) may be thermal conductivity of about 1.0 W/mK to 10 W/mK. In an embodiment, the first epoxy molding compound (EMC) may be thermal conductivity of about 3.0 W/mK to 6 W/mK. In an embodiment, the second epoxy molding compound (EMC) may be to thermal conductivity of about 0.6 W/mK to 1.0 W/mK.

As a result of a test on the Package-on-Package (POP), (1) whereas the temperature of the lower semiconductor die was measured at 92° C. when the three-dimensional integrated circuit (3D IC) structure was molded with only the molding material, (2) the temperature of the lower semiconductor die was measured at 83° C. when the three-dimensional integrated circuit (3D IC) structure was molded with the molding material 180, and the first heat dissipation structures 160A and the second heat dissipation structures 160B comprising the first epoxy molding compound.

In addition, as a result of a test on the side-by-side package, (1) whereas the temperature of the lower semiconductor die was measured at 120° C. when the three-dimensional integrated circuit (3D IC) structure was molded with only the molding material, (2) the temperature of the lower semiconductor die was measured at 98° C. when the three-dimensional integrated circuit (3D IC) structure was molded with the molding material 180, and the heat dissipation structures 160 comprising the first epoxy molding compound.

Therefore, by molding the three-dimensional integrated circuit (3D IC) structure with the molding material 180, and the heat dissipation structures 160 comprising the first epoxy molding compound having high thermal conductivity, rather than molding the three-dimensional integrated circuit (3D IC) structure with only the molding material, thermal characteristic of the semiconductor package may be improved and thereby operation performance and reliability of the semiconductor package may be enhanced.

Warpage of the semiconductor package may be generated due to a difference in coefficients of thermal expansion between structures. By adding the second epoxy molding compound (EMC) or various fillers into another type of the epoxy molding compound (EMC), the first epoxy molding compound (EMC) having a different coefficient of thermal expansion (CTE) from the second epoxy molding compound (EMC) or another type of the epoxy molding compound (EMC) may be manufactured. Therefore, when the first heat dissipation structures 160A and the second heat dissipation structures 160B are formed by filling the first epoxy molding compound (EMC) having an adjusted value of the coefficient of thermal expansion (CTE) instead of the second epoxy molding compound (EMC) into the space where the second epoxy molding compound (EMC) is supposed to fill, difference between the coefficient of thermal expansion (CTE) of other structures and the coefficient of thermal expansion (CTE) due to combination of the first heat dissipation structures 160A, the second heat dissipation structures 160B, and the molding material 180 is reduced, and thereby warpage generated due to a difference in coefficients of thermal expansion between structures may be alleviated.

The first heat dissipation structures 160A and the second heat dissipation structures 160B serve to dissipate heat generated from the three-dimensional integrated circuit (3D IC), and to improve warpages of a semiconductor package, and are disposed in consideration of heat generation position, temperature of the semiconductor package, and coefficient of thermal expansion of each component of the semiconductor package, and warpage of the semiconductor package, and accordingly, location, size, shape, and quantity of the first heat dissipation structures 160A and the second heat dissipation structures 160B are not limited. Therefore, the first heat dissipation structures 160A and the second heat dissipation structures 160B disposed at various locations, and having in various shapes, in more or less quantities, and various sizes are included in the scope of the present disclosure.

The conductive posts 170 may be disposed on the upper surface of the front side redistribution layer structure 110. The conductive posts 170 may be disposed to penetrate the molding material 180. A side surface of the conductive posts 170 may be surrounded by the molding material 180. The conductive posts 170 may electrically connect the second redistribution via 114 of the front side redistribution layer structure 110 and a third redistribution via 192 of the back side redistribution layer structure 190.

The molding material 180 may mold the three-dimensional integrated circuit (3D IC) structure 130 including the first semiconductor die 140 and the second semiconductor die 150, the first heat dissipation structure 160A, the second heat dissipation structure 160B, and the conductive posts 170, on the front side redistribution layer structure 110.

The back side redistribution layer structure 190 may be disposed on the molding material 180. The back side redistribution layer structure 190 may include a second the dielectric layer 191, and third redistribution vias 192, second redistribution lines 193, and fourth redistribution vias 194 in the second the dielectric layer 191. In another embodiment, a redistribution layer structure including a larger or smaller number of redistribution lines and redistribution vias are included in the scope of the present disclosure.

The second the dielectric layer 191 protects and insulates the third redistribution vias 192, the second redistribution lines 193, and the fourth redistribution vias 194. A semiconductor structure 210 may be disposed on an upper surface of the second the dielectric layer 191. The heat dissipation structure 160, the conductive posts 170, and the molding material 180 may be disposed on a bottom surface of the second the dielectric layer 191.

The third redistribution via 192 may be disposed between the conductive posts 170 and a second redistribution line 193. The third redistribution via 192 may electrically connect the conductive posts 170 and the second redistribution line 193 in the vertical direction. The second redistribution line 193 may be disposed between the third redistribution via 192 and a fourth redistribution via 194. The second redistribution line 193 may electrically connect the third redistribution via 192 and the fourth redistribution via 194 in the horizontal direction. The fourth redistribution via 194 may be disposed between the second redistribution line 193 and a connection member 213 of the semiconductor structure 210. The fourth redistribution via 194 may electrically connect the second redistribution line 193 and the connection member 213 of the semiconductor structure 210 in the vertical direction.

The semiconductor structure (third semiconductor die) 210 may be disposed on the back side redistribution layer structure 190. The semiconductor structure 210 may include a single chip such as a DRAM or a multi-chip such as a high bandwidth memory (HBM). The semiconductor structure 210 may include the connection member 213 and an insulation layer 212. The connection member 213 may electrically connect the semiconductor structure 210 and the back side redistribution layer structure 190. In an embodiment, the connection member 213 may include a micro-bump or solder ball. The insulation layer 212 may include the plurality of openings for soldering. The insulation layer 212 prevents the connection member 213 from being short-circuited. In an embodiment, the insulation layer 212 may include a solder resist.

Figure 2:
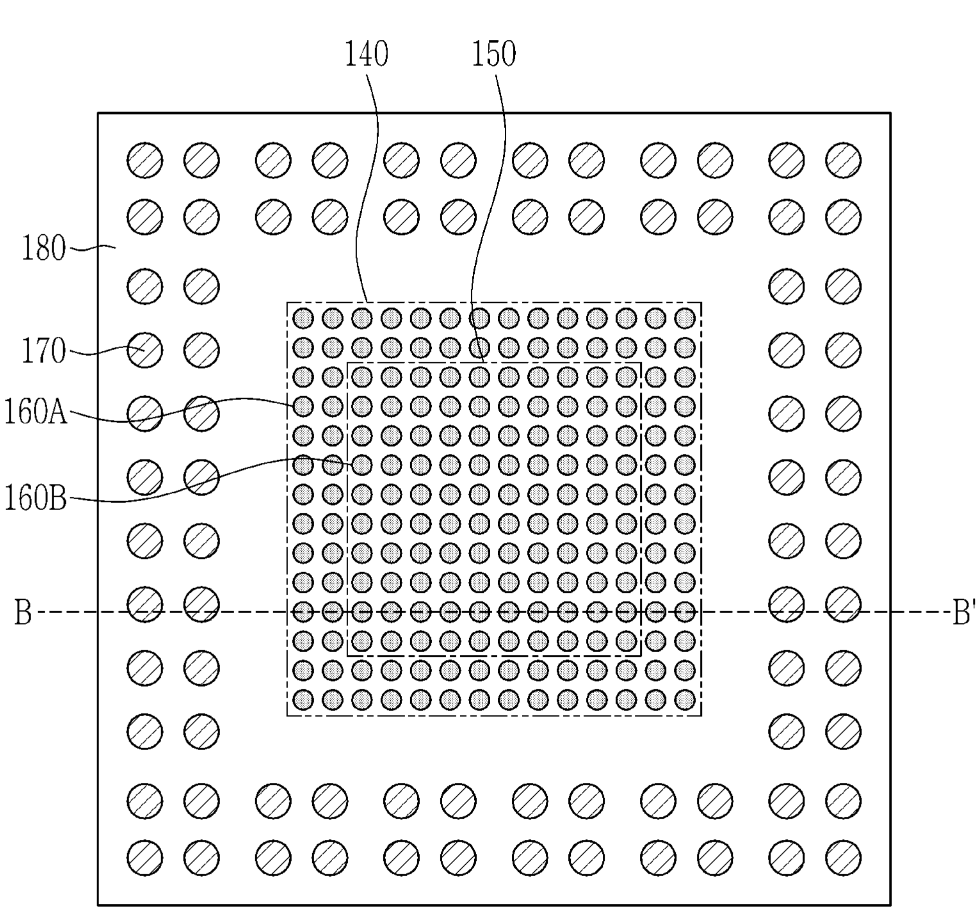
FIG. 2 is a top plan view of an example embodiment showing a semiconductor package in which first heat dissipation structures on a first semiconductor die, second heat dissipation structures on a second semiconductor die, and conductive posts are disposed within a molding material.

FIG. 2 is a top plan view showing the semiconductor package 100 in which the first heat dissipation structures 160A on the first semiconductor die 140, the second heat dissipation structures 160B on the second semiconductor die 150, and the conductive posts 170 are disposed within the molding material 180. FIG. 2 is a top plan view of a cross-sectional view of the semiconductor package 100 shown in FIG. 1 taken along line A-A'.

Referring to FIG. 2, the first semiconductor die 140 and the second semiconductor die 150 are positioned lower than line A-A' of FIG. 1, and accordingly, an outline of the first semiconductor die 140 and the second semiconductor die 150 is indicated by a dotted line. The first heat dissipation structure 160A may be disposed around the second semiconductor die 150 on the first semiconductor die 140. The second heat dissipation structure 160B may be disposed on the second semiconductor die 150. In an embodiment, the first heat dissipation structure 160A and the second heat dissipation structure 160B may include a dot, elongated, elliptical, circular, or polygonal shape. The first heat dissipation structures 160A and the second heat dissipation structures 160B may be surrounded by the molding material 180. The conductive posts 170 may be surrounded by the molding material 180. In an embodiment, each first heat dissipation structure 160A among the first heat dissipation structures 160A may be disposed at a regular interval. In an embodiment, each the second heat dissipation structure 160B among the second heat dissipation structures 160B may be disposed at a regular interval.

Figure 3:
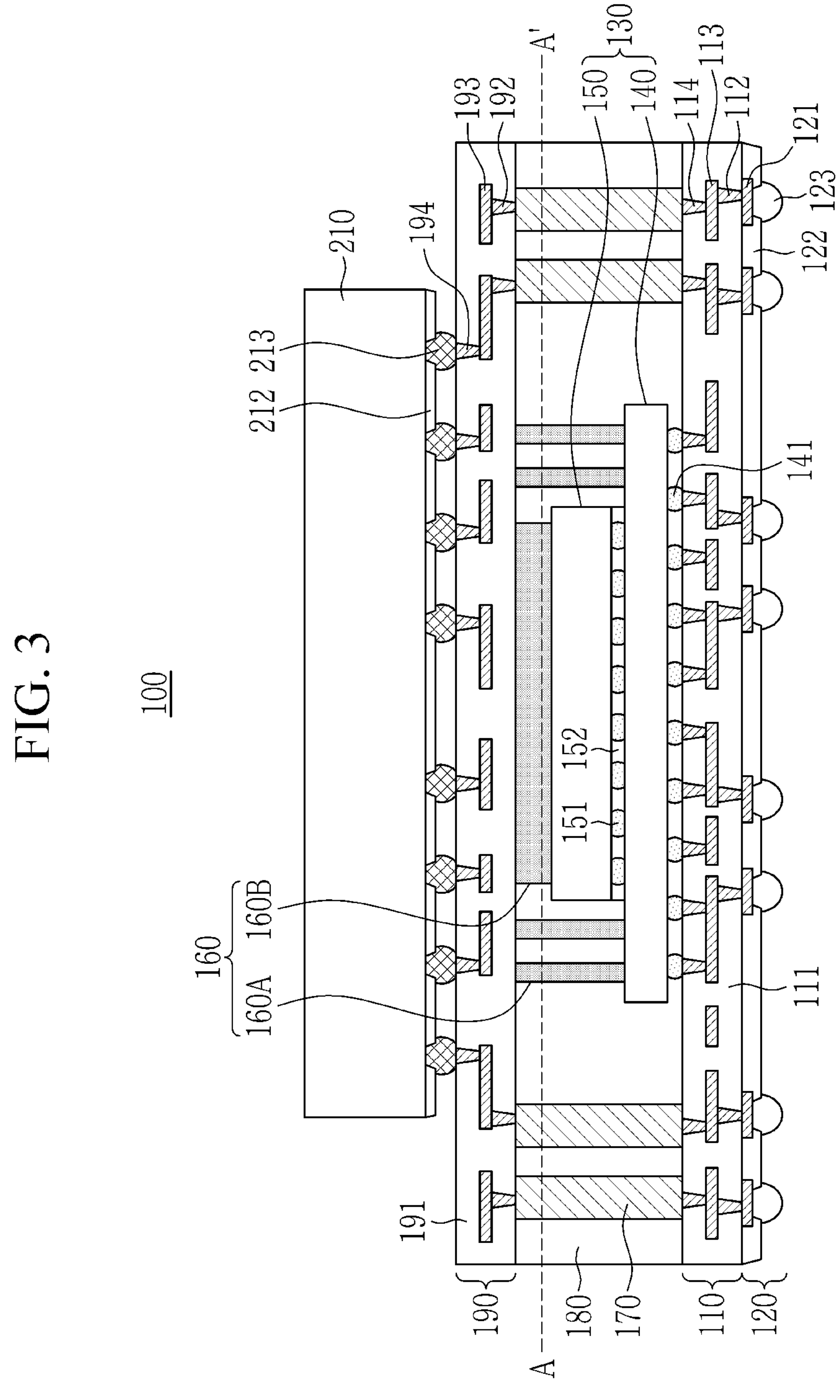
FIG. 3 is a cross-sectional view of an example embodiment showing a semiconductor package in which first heat dissipation structures having an elongated shape are disposed on a first semiconductor die, and a second heat dissipation structure having a plate shape is disposed on a second semiconductor die.

FIG. 3 is a cross-sectional view showing the semiconductor package 100 in which the first heat dissipation structures 160A having the elongated shape is disposed on the first semiconductor die 140, and the second heat dissipation structure 160B having the plate shape is disposed on the second semiconductor die 150. FIG. 3 is a cross-sectional view of a plan view of the semiconductor package 100 shown in FIG. 4 taken along line B-B'.

Referring to FIG. 3, the first heat dissipation structures 160A having the elongated shape may be disposed on the first semiconductor die 140, and the second heat dissipation structure 160B having plate shape may be disposed on the second semiconductor die 150. The contents shown in and described with respect to FIG. 1 may be equally applied to the first heat dissipation structure 160A.

The second heat dissipation structure 160B may include a plate shape in the vertical direction. A side surface of the second heat dissipation structure 160B may be surrounded by the molding material 180. The second heat dissipation structure 160B may be disposed on the second semiconductor die 150, to dissipate heat generated from the second semiconductor die 150. In the second semiconductor die 150 located at an upper portion of the three-dimensional integrated circuit (3D IC) structure 130, heat may be accumulated in a portion in contact with the molding material 180. Therefore, the second heat dissipation structure 160B may be located on the upper surface of the second semiconductor die 150 to dissipate heat accumulated in the second semiconductor die 150.

A bottom surface of the second heat dissipation structure 160B may be in physical contact with the upper surface of the second semiconductor die 150, and the upper surface of the second heat dissipation structure 160B may be in contact with the bottom surface of the dielectric layer 191 of the back side redistribution layer structure 190. Accordingly, heat accumulated in the second semiconductor die 150 may be conducted to the bottom surface of the second heat dissipation structure 160B in physical contact with the second semiconductor die 150, and then via the second heat dissipation structure 160B, conducted to the back side redistribution layer structure 190 through the upper surface of the second heat dissipation structure 160B in contact with the bottom surface of the dielectric layer 191 of the back side redistribution layer structure 190.

The second heat dissipation structure 160B serves to dissipate heat generated from the three-dimensional integrated circuit (3D IC), and to improve warpage of a semiconductor package, and is disposed in consideration of heat generation position, temperature of the semiconductor package, coefficient of thermal expansion of each component of the semiconductor package, and warpage of the semiconductor package, and accordingly, location, size, shape, and quantity of the second heat dissipation structure 160B are not limited. Therefore, the second heat dissipation structure 160B disposed at various locations, and having in various shapes, in more or less quantities, and various sizes are included in the scope of the present disclosure.

Features and configurations other than the plate shape of the second heat dissipation structure 160B in FIG. 3 are the same as those described with respect to FIG. 1. Therefore, the contents described with respect to FIG. 1 may be equally applied to the features and configurations other than the plate shape of the second heat dissipation structure 160B in FIG. 3.

Figure 4:
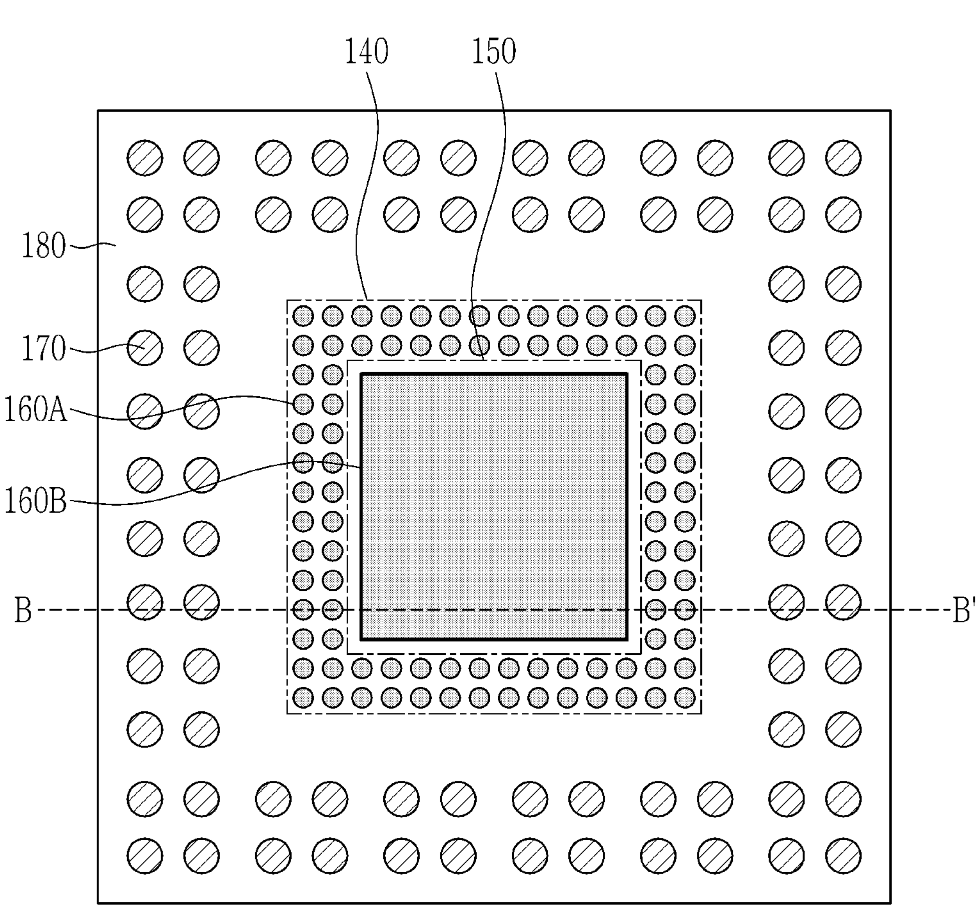
FIG. 4 is a top plan view of an example embodiment showing a semiconductor package in which first heat dissipation structures on a first semiconductor die, a second heat dissipation structure on a second semiconductor die, and conductive posts are disposed within a molding material.

FIG. 4 is a top plan view showing the semiconductor package 100 in which the first heat dissipation structures 160A on the first semiconductor die 140, the second heat dissipation structure 160B on the second semiconductor die 150, and the conductive posts 170 are disposed within the molding material 180. FIG. 4 is a top plan view of a cross-sectional view of the semiconductor package 100 shown in FIG. 3 taken along line A-A'.

Referring to FIG. 4, the first semiconductor die 140 and the second semiconductor die 150 are positioned lower than line A-A' of FIG. 3, and accordingly, an outline of the first semiconductor die 140 and the second semiconductor die 150 is indicated by a dotted line. The first heat dissipation structure 160A may be disposed around the second semiconductor die 150 on the first semiconductor die 140. The second heat dissipation structure 160B may be disposed on the second semiconductor die 150. In an embodiment, the first heat dissipation structure 160A may include a dot, elongated, elliptical, circular, or polygonal shape. In an embodiment, the second heat dissipation structure 160B may include the plate shape. In an embodiment, the second heat dissipation structure 160B may include a shape obtained by scaling a shape of the second semiconductor die 150. The first heat dissipation structure 160A, the second heat dissipation structure 160B, and the conductive posts 170 may be surrounded by the molding material 180.

Figure 5:
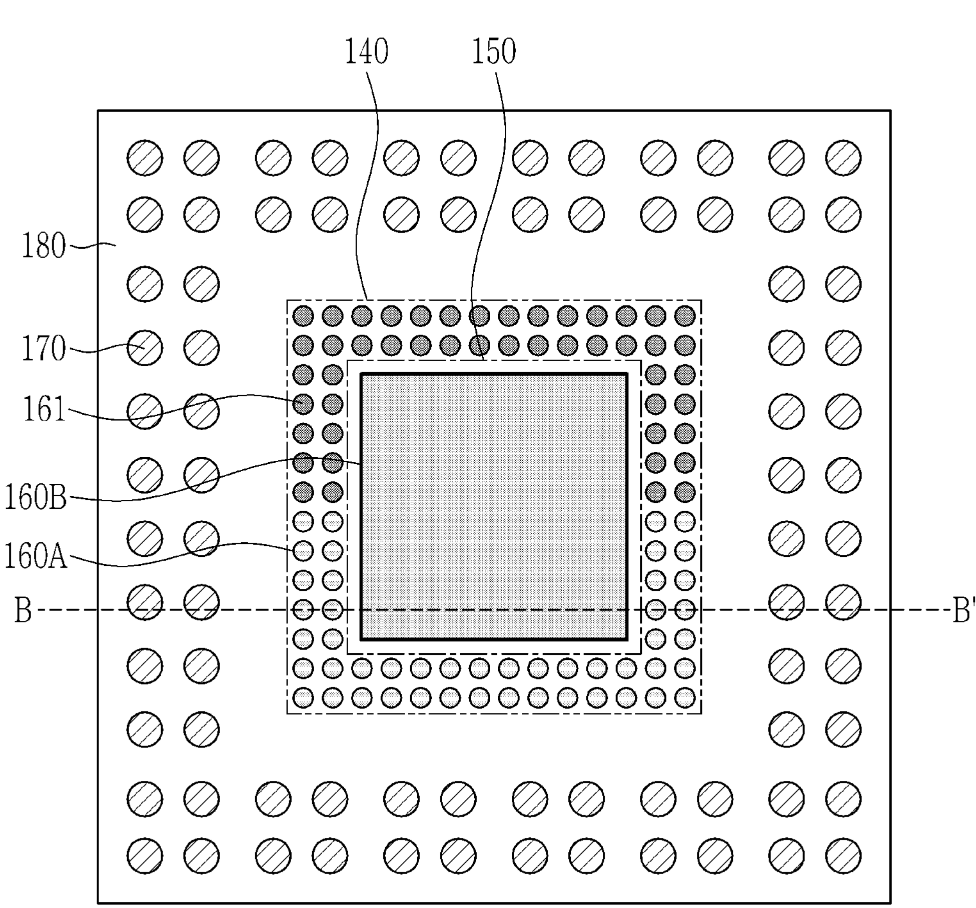
FIG. 5 is a top plan view of an example embodiment showing a semiconductor package in which first heat dissipation structures and additional heat dissipation structures on a first semiconductor die, second heat dissipation structures on a second semiconductor die, and conductive posts are disposed within a molding material.

FIG. 5 is a top plan view showing the semiconductor package 100 in which the first heat dissipation structures 160A and an additional heat dissipation structures 161 on the first semiconductor die 140, the second heat dissipation structure 160B on the second semiconductor die 150, and the conductive posts 170 are disposed within the molding material 180. FIG. 5 is a top plan view of a cross-sectional view of the semiconductor package 100 shown in FIG. 3 taken along line A-A' according to another embodiment.

Referring to FIG. 5, the first heat dissipation structures 160A and the additional heat dissipation structures 161 may be disposed on the first semiconductor die 140. In the case of an asymmetric semiconductor structure, positions where heat is accumulated on the first semiconductor die 140 and the second semiconductor die 150 may also be asymmetric. In this case, in consideration of location where heat is accumulated, the additional heat dissipation structures 161 may be dispose in addition to the first heat dissipation structures 160A and the second heat dissipation structure 160B.

In an embodiment, the additional heat dissipation structures 161 may be third to n-th heat dissipation structures. At this time, n may be a natural number greater than or equal to 3. In an embodiment, third to n-th heat dissipation structures 161 may be third to n-th epoxy molding compound (EMC), respectively. In an embodiment, third to n-th epoxy molding compound (EMC) may have higher thermal conductivity than the second epoxy molding compound (EMC), and coefficient of thermal expansion (CTE) different from the coefficient of thermal expansion (CTE) of the second epoxy molding compound (EMC). Therefore, the heat dissipation path in the upward direction of the semiconductor structure with respect to the asymmetrically accumulated heat may be secured.

According to the disclosure of FIG. 5, it is illustrated that the additional heat dissipation structures 161 is disposed on the first semiconductor die 140, however, the additional heat dissipation structures 161 may be disposed on the second semiconductor die 150, or disposed on all of the first semiconductor die 140 and the second semiconductor die 150. In addition, the additional heat dissipation structures 161 is disposed to secure the heat dissipation path of the semiconductor structure in the upward direction with respect to the asymmetrically accumulated heat, and accordingly, location, size, shape, and quantity of the additional heat dissipation structures 161 are not limited. Therefore, the additional heat dissipation structures 161 disposed at various locations, and having in various shapes, in more or less quantities, and various sizes are included in the scope of the present disclosure.

Figure 6:
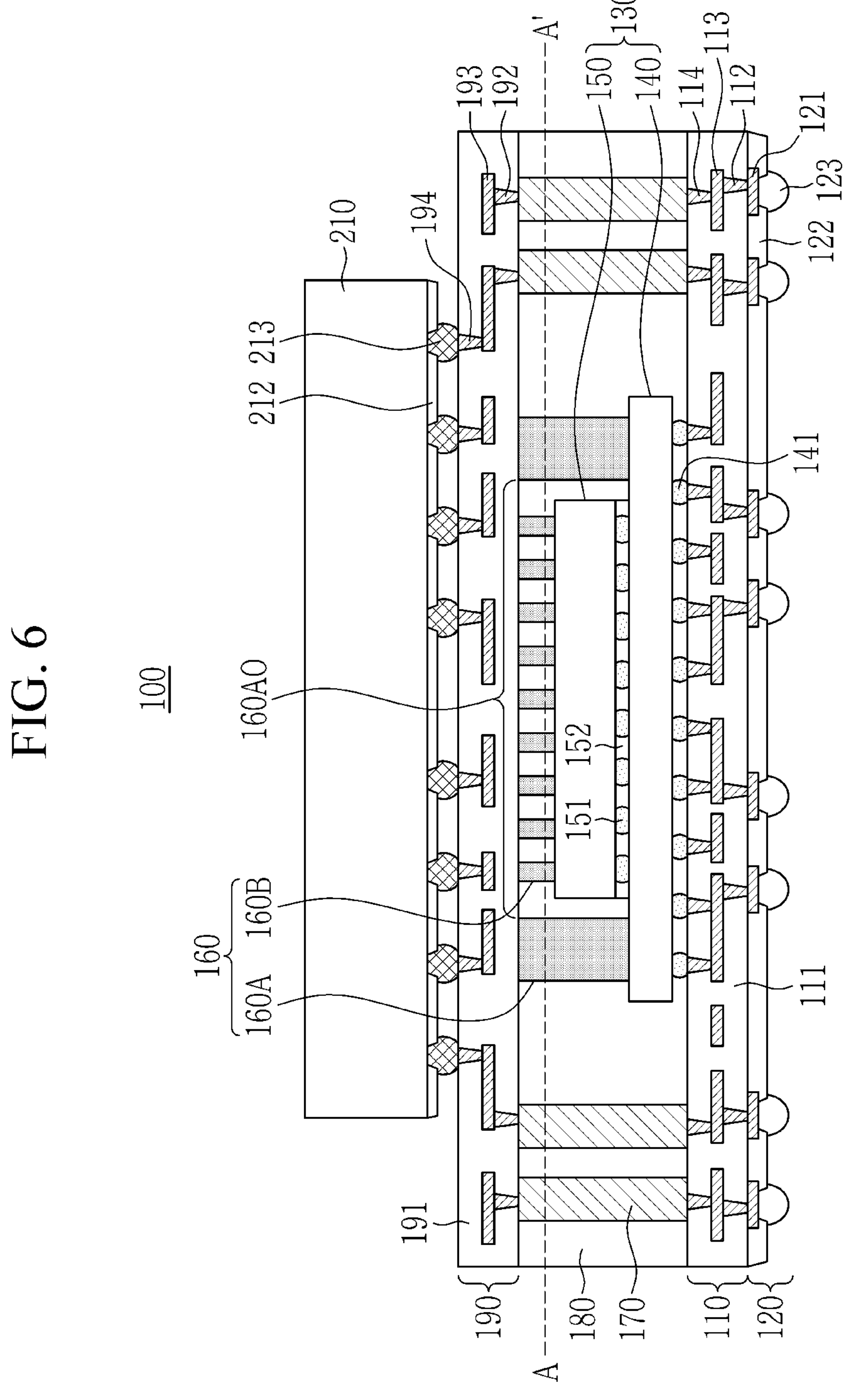
FIG. 6 is a cross-sectional view of an example embodiment showing a semiconductor package in which a first heat dissipation structure having a plate shape including a through opening is disposed on a first semiconductor die, and second heat dissipation structures having an elongated shape are disposed on a second semiconductor die.

FIG. 6 is a cross-sectional view showing the semiconductor package 100 in which the first heat dissipation structure 160A having the plate shape including a through opening 160AO is disposed on the first semiconductor die 140, and the second heat dissipation structures 160B the the elongated shape is disposed on the second semiconductor die 150. FIG. 6 is a cross-sectional view of a plan view of the semiconductor package 100 shown in FIG. 7 taken along line B-B'.

Referring to FIG. 6, the plate-shaped the first heat dissipation structure 160A including the through opening 160AO may be disposed on the first semiconductor die 140, and the second heat dissipation structures 160B of the elongated shape may be disposed on the second semiconductor die 150. The first heat dissipation structure 160A may include the plate shape including the through opening 160AO. The first heat dissipation structure 160A may be disposed on the first semiconductor die 140 to dissipate heat generated from the first semiconductor die 140. In the first semiconductor die 140 located at a lower portion of the three-dimensional integrated circuit (3D IC) structure 130, heat may be accumulated in an edge portion in contact with the molding material 180 rather than a central portion. Therefore, the first heat dissipation structure 160A may be located on the edge portion of the first semiconductor die 140 to dissipate heat accumulated in the first semiconductor die 140.

An exterior surface and an interior surface of the first heat dissipation structure 160A may be surrounded by the molding material 180. A bottom surface of the first heat dissipation structure 160A may be in physical contact with the upper surface of the first semiconductor die 140, and the upper surface of the first heat dissipation structure 160A may be in contact with the bottom surface of the dielectric layer 191 of the back side redistribution layer structure 190. Accordingly, heat accumulated in the first semiconductor die 140 may be conducted to the bottom surface of the first heat dissipation structure 160A in physical contact with the first semiconductor die 140, and then via the first heat dissipation structure 160A, conducted to the back side redistribution layer structure 190, through the upper surface of the first heat dissipation structure 160A in contact with the bottom surface of the dielectric layer 191 of the back side redistribution layer structure 190.

The first heat dissipation structure 160A serves to dissipate heat generated from the three-dimensional integrated circuit (3D IC), and to improve warpage of a semiconductor package, and is disposed in consideration of heat generation position, temperature of the semiconductor package, coefficient of thermal expansion of each component of the semiconductor package, and warpage of the semiconductor package, and accordingly, location, size, shape, and quantity of the first heat dissipation structure 160A are not limited. Therefore, the first heat dissipation structure 160A disposed at various locations, and having in various shapes, in more or less quantities, and various sizes are included in the scope of the present disclosure.

Figure 7:
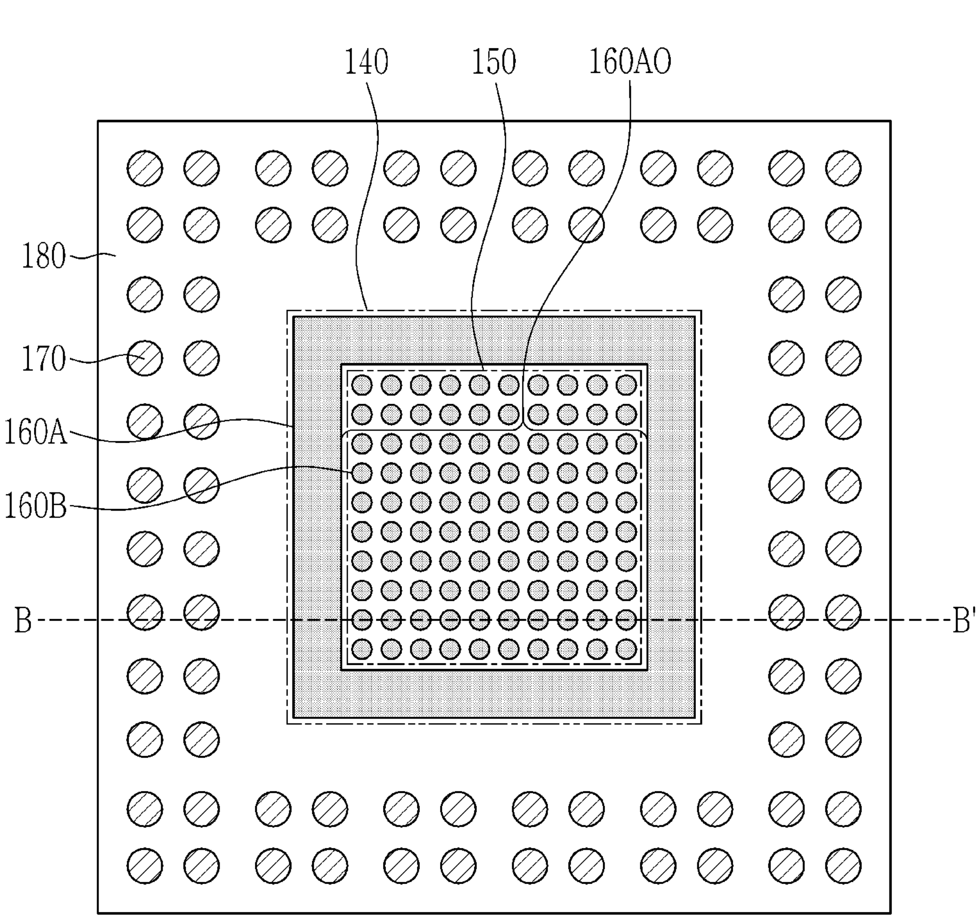
FIG. 7 is a top plan view of an example embodiment showing a semiconductor package in which a first heat dissipation structure on a first semiconductor die, second heat dissipation structures on a second semiconductor die, and conductive posts are disposed within a molding material.

FIG. 7 is a top plan view showing the semiconductor package 100 in which the first heat dissipation structure 160A on the first semiconductor die 140, the second heat dissipation structures 160B on the second semiconductor die 150, and the conductive posts 170 are disposed within the molding material 180. FIG. 7 is a top plan view of a cross-sectional view of the semiconductor package 100 shown in FIG. 6 taken along line A-A'.

Referring to FIG. 7, the first semiconductor die 140 and the second semiconductor die 150 are positioned lower than line A-A' of FIG. 6, and accordingly, an outline of the first semiconductor die 140 and the second semiconductor die 150 is indicated by a dotted line. The first heat dissipation structure 160A may be disposed around the second semiconductor die 150 on the first semiconductor die 140. The second heat dissipation structure 160B may be disposed on the second semiconductor die 150. The first heat dissipation structure 160A may include the plate shape including the through opening 160AO. In an embodiment, an outer edge of the first heat dissipation structure 160A may include a shape obtained by scaling a shape of the first semiconductor die 140. In an embodiment, the second heat dissipation structure 160B may include a dot, elongated, elliptical, circular, or polygonal shape. The first heat dissipation structure 160A, the second heat dissipation structure 160B, and the conductive posts 170 may be surrounded by the molding material 180.

Figure 8:
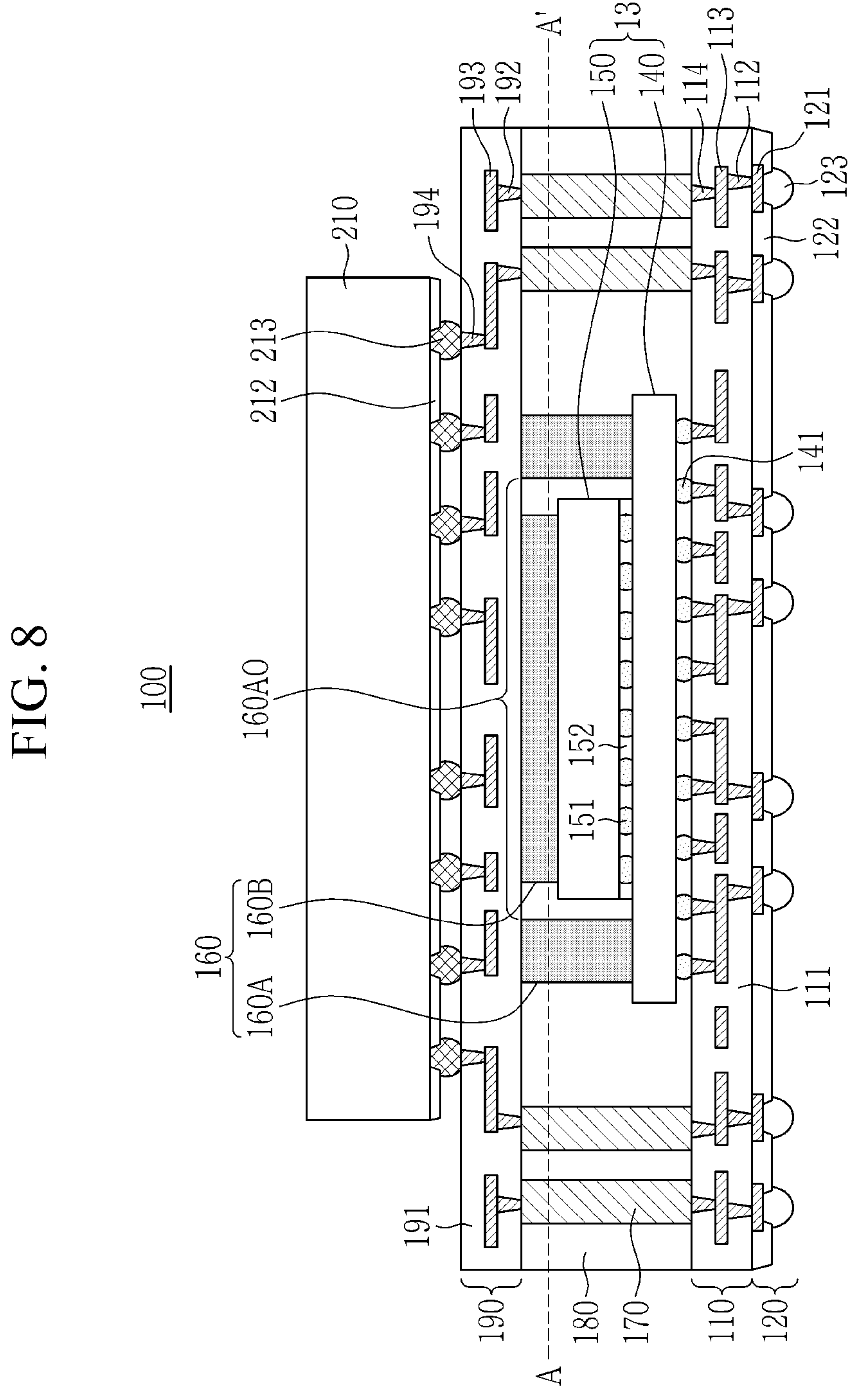
FIG. 8 is a cross-sectional view of an example embodiment showing a semiconductor package in which a first heat dissipation structure having a plate shape including a through opening is disposed on a first semiconductor die, and a second heat dissipation structure having a plate shape is disposed on a second semiconductor die.

FIG. 8 is a cross-sectional view showing the semiconductor package 100 in which the first heat dissipation structure 160A having the plate shape including the through opening 160AO is disposed on the first semiconductor die 140, and the second heat dissipation structure 160B having the plate shape is disposed on the second semiconductor die 150. FIG. 6 is a cross-sectional view of a plan view of the semiconductor package 100 shown in FIG. 7 taken along line B-B'.

Referring to FIG. 8, the first heat dissipation structure 160A having the plate shape including the through opening 160AO may be disposed on the first semiconductor die 140, and the second heat dissipation structure 160B having the plate shape may be disposed on the second semiconductor die 150. The first heat dissipation structure 160A may include the plate shape including the through opening 160AO. The first heat dissipation structure 160A of FIG. 8 is the same as the first heat dissipation structure 160A shown in and described with respect to FIG. 6. Therefore, the contents for the first heat dissipation structure 160A shown in and described with respect to FIG. 6 may be equally applied to the first heat dissipation structure 160A of FIG. 8.

The second heat dissipation structure 160B may include the plate shape. The second heat dissipation structure 160B of FIG. 8 is the same as the second heat dissipation structure 160B shown in and described with respect to FIG. 3. Therefore, the contents for the second heat dissipation structure 160B shown in and described with respect to FIG. 3 may be equally applied to the second heat dissipation structure 160B of FIG. 8.

Figure 9:
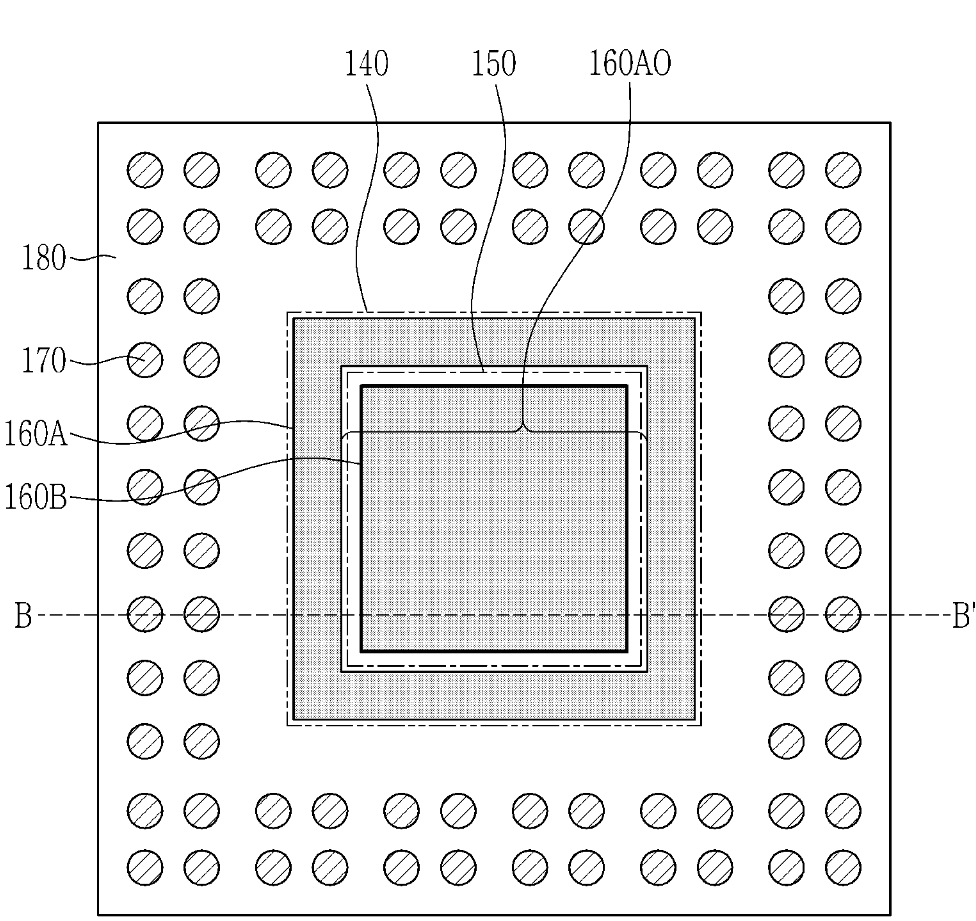
FIG. 9 is a top plan view of an example embodiment showing a semiconductor package in which a first heat dissipation structure on a first semiconductor die, a second heat dissipation structure on a second semiconductor die, and conductive posts are disposed within a molding material.

FIG. 9 is a top plan view showing the semiconductor package 100 in which the first heat dissipation structure 160A on the first semiconductor die 140, the second heat dissipation structure 160B on the second semiconductor die 150, and the conductive posts 170 are disposed within the molding material 180. FIG. 9 is a top plan view of a cross-sectional view of the semiconductor package 100 shown in FIG. 8 taken along line A-A'.

Referring to FIG. 9, the first semiconductor die 140 and the second semiconductor die 150 are positioned lower than line A-A' of FIG. 8, and accordingly, an outline of the first semiconductor die 140 and the second semiconductor die 150 is indicated by a dotted line. The first heat dissipation structure 160A may be disposed around the second semiconductor die 150 on the first semiconductor die 140. The second heat dissipation structure 160B may be disposed on the second semiconductor die 150. The first heat dissipation structure 160A may include the plate shape including the through opening 160AO. In an embodiment, the second heat dissipation structure 160B may include the plate shape. The first heat dissipation structure 160A, the second heat dissipation structure 160B and the conductive posts 170 may be surrounded by the molding material 180.

Figure 10:
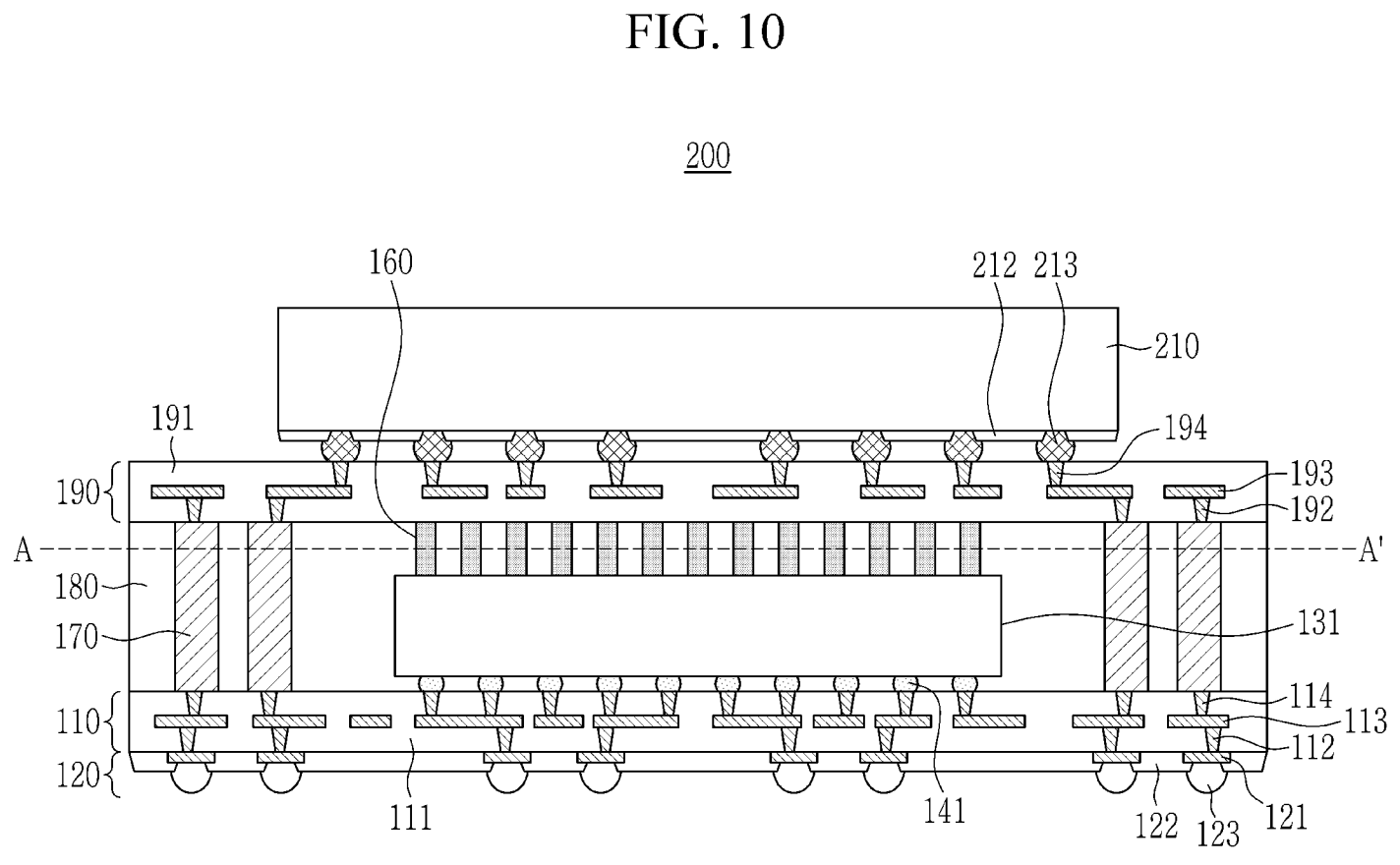

FIG. 10 is a cross-sectional view showing a semiconductor package 200 in which the heat dissipation structures 160 having the elongated shape is disposed on a fourth semiconductor die 131. FIG. 10 is a cross-sectional view of a plan view of the semiconductor package 200 shown in FIG. 11 taken along line B-B'.

Referring to FIG. 10, the heat dissipation structures 160 having the elongated shape may be disposed on the fourth semiconductor die 131. In an embodiment, the fourth semiconductor die 131 may include a system-on-chip (SOC). In an embodiment, the fourth semiconductor die 131 may include at least one of a central processing unit (CPU), a graphic processing unit (GPU), a memory, a controller, a codec, a sensor, and a communication chip. The fourth semiconductor die 131 includes the connection member 141, and may be electrically connected to the second redistribution via 114 of the front side redistribution layer structure 110 through the connection member 141. In an embodiment, the connection member 141 may include a micro-bump.

The heat dissipation structures 160 may be disposed on the fourth semiconductor die 131 to dissipate heat generated from the fourth semiconductor die 131. In the fourth semiconductor die 131, heat may be accumulated in a portion in contact with the molding material 180. Therefore, the heat dissipation structures 160 may be located on the upper surface of the fourth semiconductor die 131 to dissipate heat accumulated in the fourth semiconductor die 131.

The heat dissipation structure 160 may include the elongated shape in the vertical direction. The side surface of the heat dissipation structures 160 may be surrounded by the molding material 180. one end of heat dissipation structure 160 may be in physical contact with the upper surface of the fourth semiconductor die 131, and the other end of heat dissipation structure 160 may be in contact with the bottom surface of the dielectric layer 191 of the back side redistribution layer structure 190. Accordingly, heat accumulated in the fourth semiconductor die 131 may be conducted to the one end of heat dissipation structure 160 in physical contact with the fourth semiconductor die 131, and then via the heat dissipation structure 160, conducted to the back side redistribution layer structure 190 through the other end of heat dissipation structure 160 in contact with the bottom surface of the dielectric layer 191 of the back side redistribution layer structure 190.

The heat dissipation structures 160 serves to dissipate heat generated from the fourth semiconductor die 131, and to improve warpages of a semiconductor package, and is disposed in consideration of heat generation position, temperature of the semiconductor package, coefficient of thermal expansion of each component of the semiconductor package, and warpage of the semiconductor package, and accordingly, location, size, shape, and quantity of the heat dissipation structures 160 are not limited. Therefore, the heat dissipation structures 160 disposed at various locations, and having in various shapes, in more or less quantities, and various sizes are included in the scope of the present disclosure.

Features and configurations other than the fourth semiconductor die 131 and the features related the coupling relationship between the fourth semiconductor die 131 and the heat dissipation structure 160 in FIG. 10 are the same as those descried with respect to FIG. 1. Therefore, the contents described with respect to FIG. 1 may be equally applied to the features and configurations other than the fourth semiconductor die 131 and the features related the coupling relationship between the fourth semiconductor die 131 and the heat dissipation structure 160 in FIG. 10.

Figure 11:
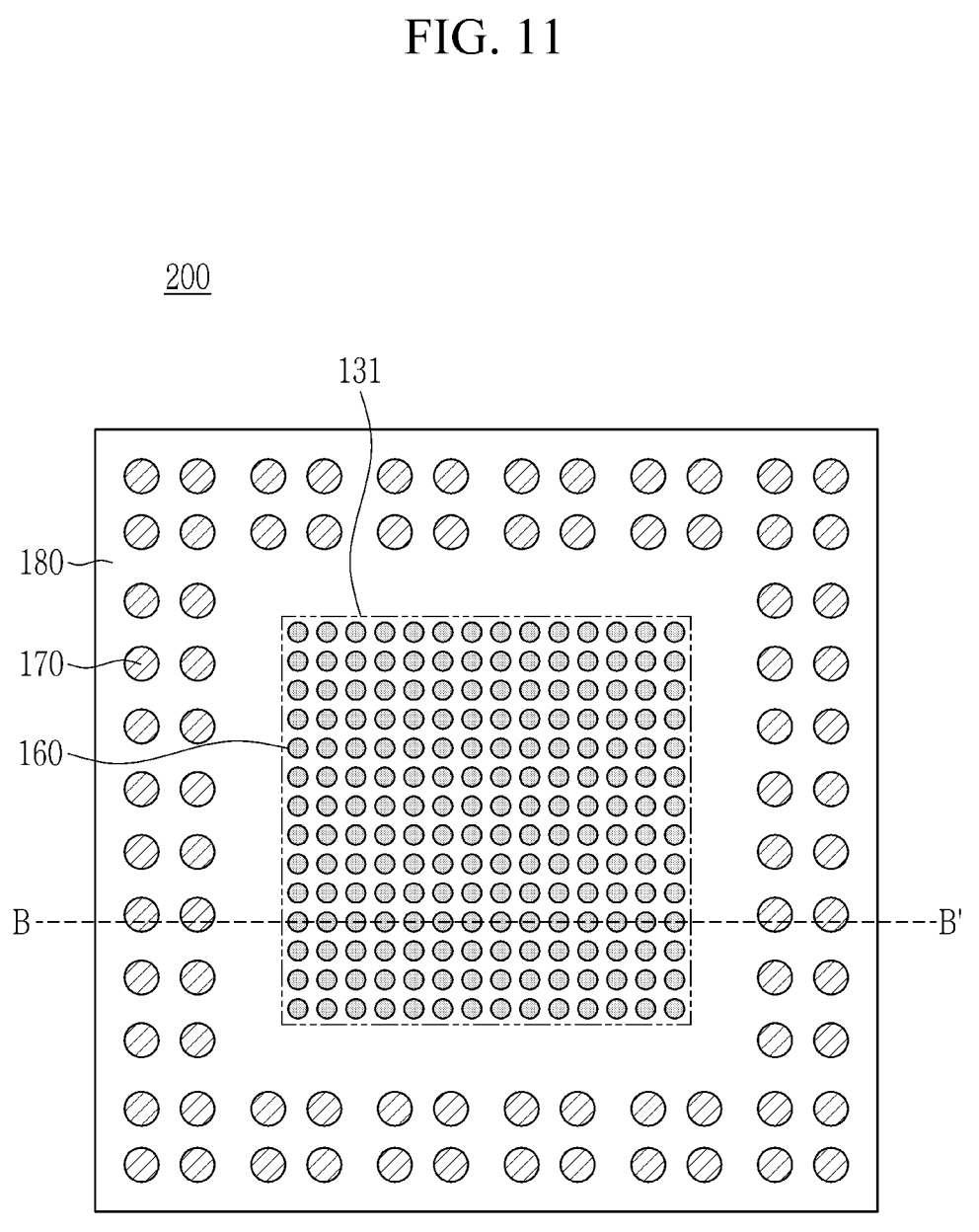

FIG. 11 is a top plan view showing the semiconductor package 200 in which the conductive posts 170 and the heat dissipation structures 160 on a semiconductor die are disposed within the molding material 180. FIG. 11 is a top plan view of a cross-sectional view of the semiconductor package 200 shown in FIG. 10 taken along line A-A'.

Referring to FIG. 11, the fourth semiconductor die 131 is positioned lower than line A-A' of FIG. 10, and accordingly, an outline of the fourth semiconductor die 131 is indicated by a dotted line. The heat dissipation structure 160 may be disposed on the fourth semiconductor die 131. In an embodiment, the heat dissipation structure 160 may include a dot, elongated, elliptical, circular, or polygonal shape. The heat dissipation structures 160 and the conductive posts 170 may be surrounded by the molding material 180.

Figure 12:
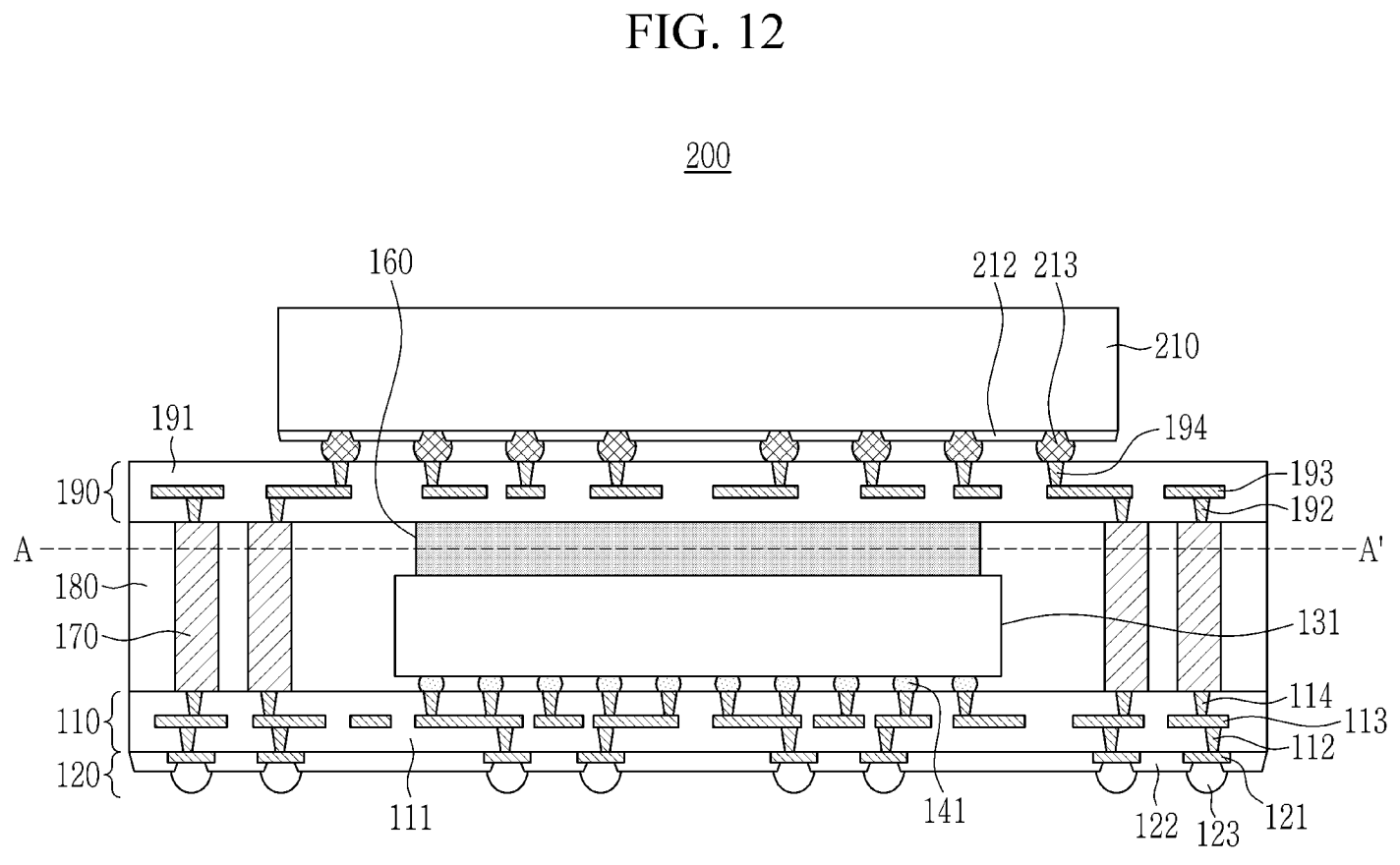

FIG. 12 is a cross-sectional view showing the semiconductor package 200 in which the heat dissipation structure 160 having a plate shape is disposed on the fourth semiconductor die 131. FIG. 12 is a cross-sectional view of a plan view of the semiconductor package 200 shown in FIG. 13 taken along line B-B'.

Referring to FIG. 12, the heat dissipation structure 160 having the plate shape may be disposed on the fourth semiconductor die 131. The heat dissipation structure 160 may include the plate shape in the vertical direction. A side surface of the heat dissipation structure 160 may be surrounded by the molding material 180. The heat dissipation structure 160 may be disposed on the fourth semiconductor die 131 to dissipate heat generated from the fourth semiconductor die 131. In the fourth semiconductor die 131, heat may be accumulated in a portion in contact with the molding material 180. Therefore, the heat dissipation structure 160 may be located on the upper surface of the fourth semiconductor die 131 to dissipate heat accumulated in the fourth semiconductor die 131.

A bottom surface of the heat dissipation structure 160 may be in physical contact with the upper surface of the fourth semiconductor die 131, and an upper surface of the heat dissipation structure 160 may be in contact with the bottom surface of the dielectric layer 191 of the back side redistribution layer structure 190. Accordingly, heat accumulated in the fourth semiconductor die 131 may be conducted to the bottom surface of the heat dissipation structure 160 in physical contact with the fourth semiconductor die 131, and then via the heat dissipation structure 160, conducted to the back side redistribution layer structure 190 through the upper surface of the heat dissipation structure 160 in contact with the bottom surface of the dielectric layer 191 of the back side redistribution layer structure 190.

The heat dissipation structure 160 serves to dissipate heat generated from the fourth semiconductor die 131, and to improve warpages of a semiconductor package, and is disposed in consideration of heat generation position, temperature of the semiconductor package, coefficient of thermal expansion of each component of the semiconductor package, and warpage of the semiconductor package, and accordingly, location, size, shape, and quantity of the heat dissipation structure 160 are not limited. Therefore, the heat dissipation structure 160 disposed at various locations, and having in various shapes, in more or less quantities, and various sizes are included in the scope of the present disclosure.

Features and configurations other than the plate shape of the second heat dissipation structure 160B in FIG. 12 are the same as those described with respect to FIG. 10. Therefore, the contents described with respect to FIG. 10 may be equally applied to the features and configurations other than the plate shape of the second heat dissipation structure 160B in FIG. 12.

Figure 13:
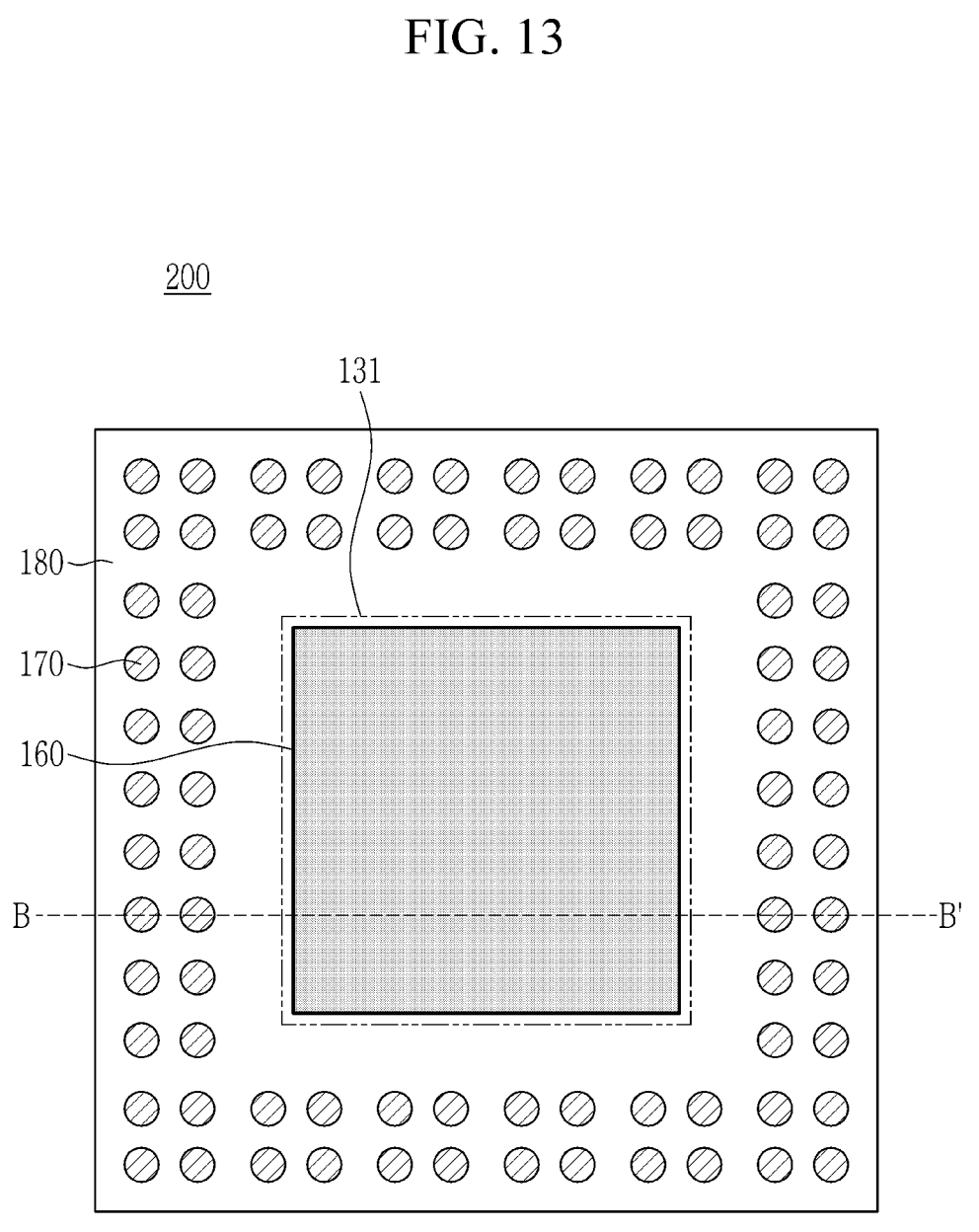

FIG. 13 is a top plan view showing the semiconductor package 200 in which the heat dissipation structure 160 on the fourth semiconductor die 131, and the conductive posts 170 are disposed within the molding material 180. FIG. 13 is a top plan view of a cross-sectional view of the semiconductor package 200 shown in FIG. 12 taken along line A-A'.

Referring to FIG. 13, the fourth semiconductor die 131 is positioned lower than line A-A' of FIG. 12, and accordingly, an outline of the fourth semiconductor die 131 is indicated by a dotted line. The heat dissipation structure 160 may be disposed on the fourth semiconductor die 131. In an embodiment, the heat dissipation structure 160 may include the plate shape. The heat dissipation structures 160 and the conductive posts 170 may be surrounded by the molding material 180.

Figure 14:
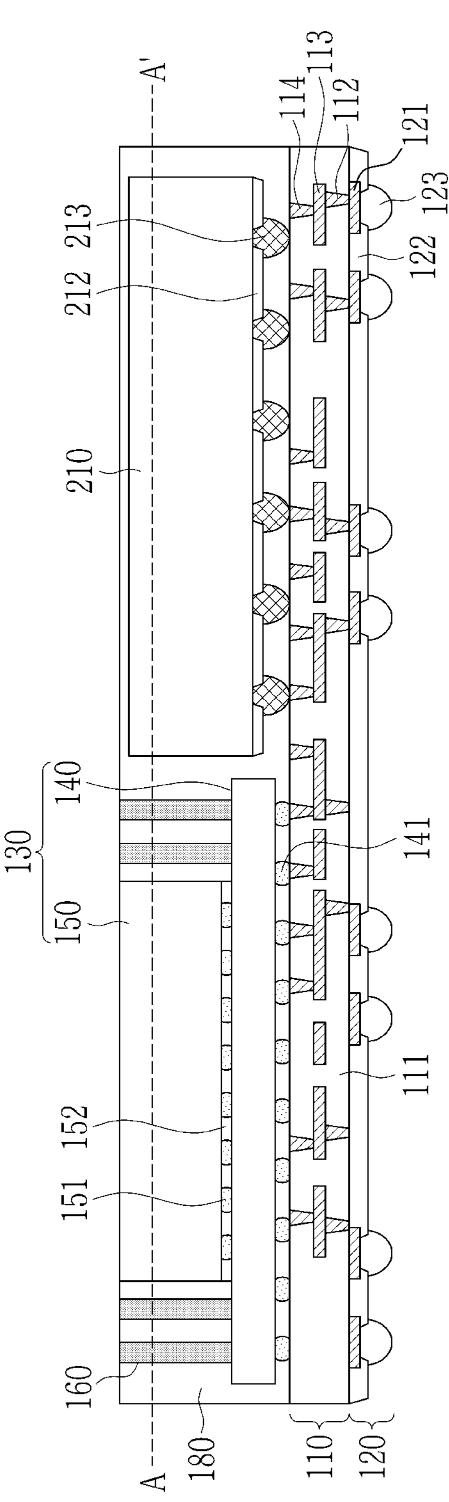
FIG. 14 is a cross-sectional view of an example embodiment showing a semiconductor package in which heat dissipation structures of an elongated shape is disposed on a first semiconductor die of a three-dimensional integrated circuit structure, and a second semiconductor die of a three-dimensional integrated circuit structure is exposed to an outside.

FIG. 14 is a cross-sectional view showing a semiconductor package 300 in which the heat dissipation structures 160 having the elongated shape is disposed on the first semiconductor die 140 of the three-dimensional integrated circuit (3D IC) structure 130, and the second semiconductor die 150 of the three-dimensional integrated circuit (3D IC) structure 130 is exposed. FIG. 14 is a cross-sectional view of a plan view of the semiconductor package 300 shown in FIG. 15 taken along line B-B'.

Referring to FIG. 14, the semiconductor package 300 is a side-by-side package in which the three-dimensional integrated circuit (3D IC) structure 130 and the semiconductor structure 210 are disposed side by side on the redistribution layer structure 110. The heat dissipation structure 160 is disposed on the first semiconductor die 140, and not disposed on the second semiconductor die 150 of which an upper surface is exposed to the outside.

The heat dissipation structure 160 may include the elongated shape in the vertical direction. The side surface of the heat dissipation structures 160 may be surrounded by the molding material 180. The heat dissipation structures 160 may be disposed on the first semiconductor die 140 to dissipate heat generated from the first semiconductor die 140.

The one end of heat dissipation structure 160 may be in physical contact with the upper surface of the first semiconductor die 140, and the other end of heat dissipation structure 160 may be exposed to the outside. Accordingly, heat accumulated in the first semiconductor die 140 may be conducted to the one end of heat dissipation structure 160 in physical contact with the first semiconductor die 140, and via the heat dissipation structure 160, may be dissipated to the outside through the other end of heat dissipation structure 160 exposed to the outside.

In FIG. 14, features and configurations other than the point that the semiconductor package 300 is a side-by-side package in which the three-dimensional integrated circuit (3D IC) structure 130 and the semiconductor structure 210 are disposed side by side on the redistribution layer structure 110, and the heat dissipation structure 160 is disposed on the first semiconductor die 140, and not disposed on the second semiconductor die 150 of which an upper surface is exposed to the outside are the same as those described with respect to FIG. 1. Therefore, in FIG. 14, the contents described with respect to FIG. 1 may be equally applied to the features and configurations other than the point that the semiconductor package 300 is a side-by-side package in which the three-dimensional integrated circuit (3D IC) structure 130 and the semiconductor structure 210 are disposed side by side on the redistribution layer structure 110, and the heat dissipation structure 160 is disposed on the first semiconductor die 140, and not disposed on the second semiconductor die 150 of which an upper surface is exposed to the outside.

Figure 15:
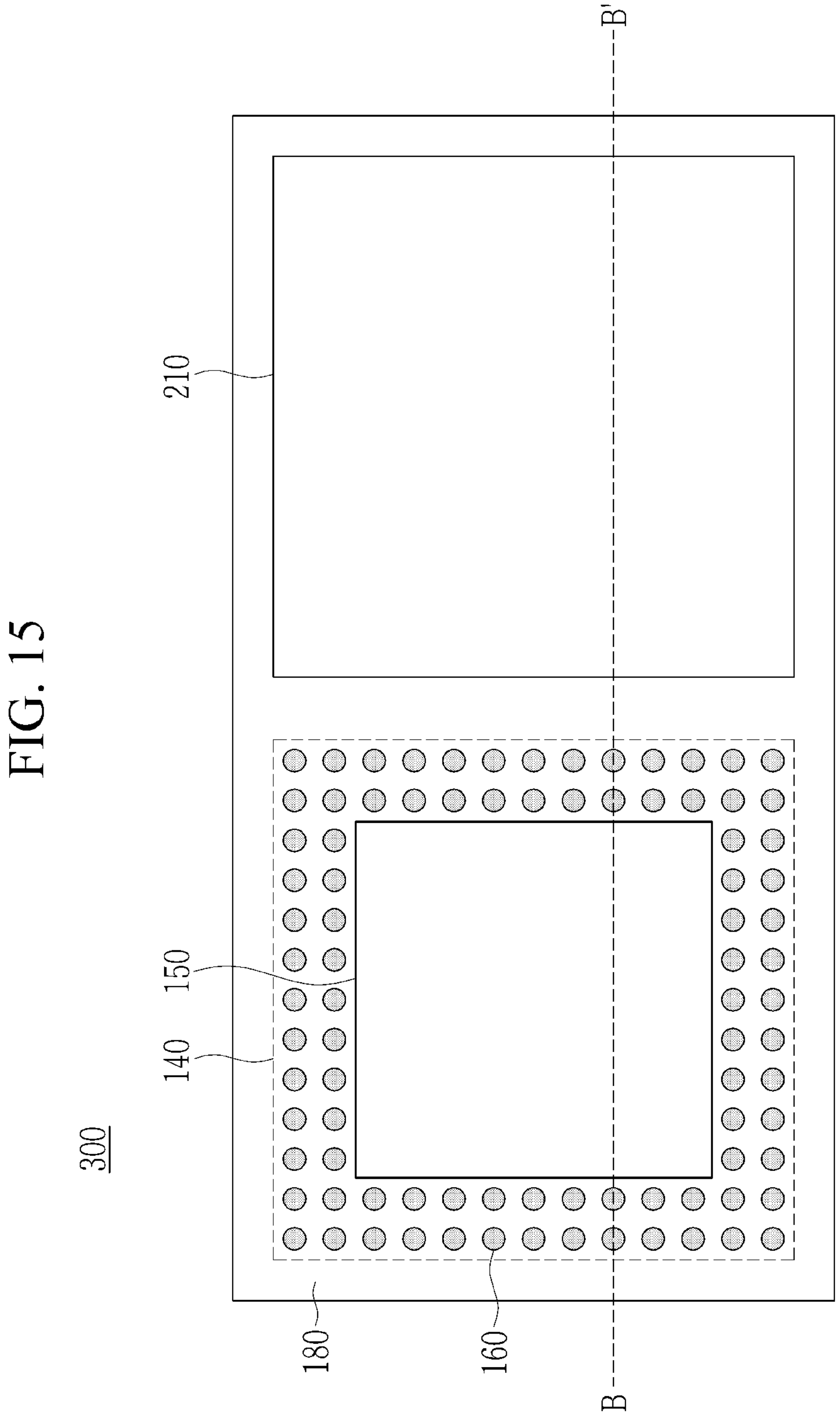
FIG. 15 is a top plan view of an example embodiment showing a semiconductor package in which heat dissipation structures on a first semiconductor die, a second semiconductor die, and semiconductor structure (third semiconductor die) are disposed within a molding material.

FIG. 15 is a top plan view showing the semiconductor package 300 in which the heat dissipation structures 160 on the first semiconductor die 140, the second semiconductor die 150, and the semiconductor structure 210 are disposed within the molding material 180. FIG. 15 is a top plan view of a cross-sectional view of the semiconductor package 300 shown in FIG. 14 taken along line A-A'.

Referring to FIG. 15, the first semiconductor die 140 is positioned lower than line A-A' of FIG. 14, and accordingly, an outline of the first semiconductor die 140 is indicated by a dotted line. The heat dissipation structure 160 may be disposed around the second semiconductor die 150 on the first semiconductor die 140. In an embodiment, the heat dissipation structure 160 may include a dot, elongated, elliptical, circular, or polygonal shape. The heat dissipation structures 160, the conductive posts 170 and the semiconductor structure 210 may be surrounded by the molding material 180.

Figure 16:
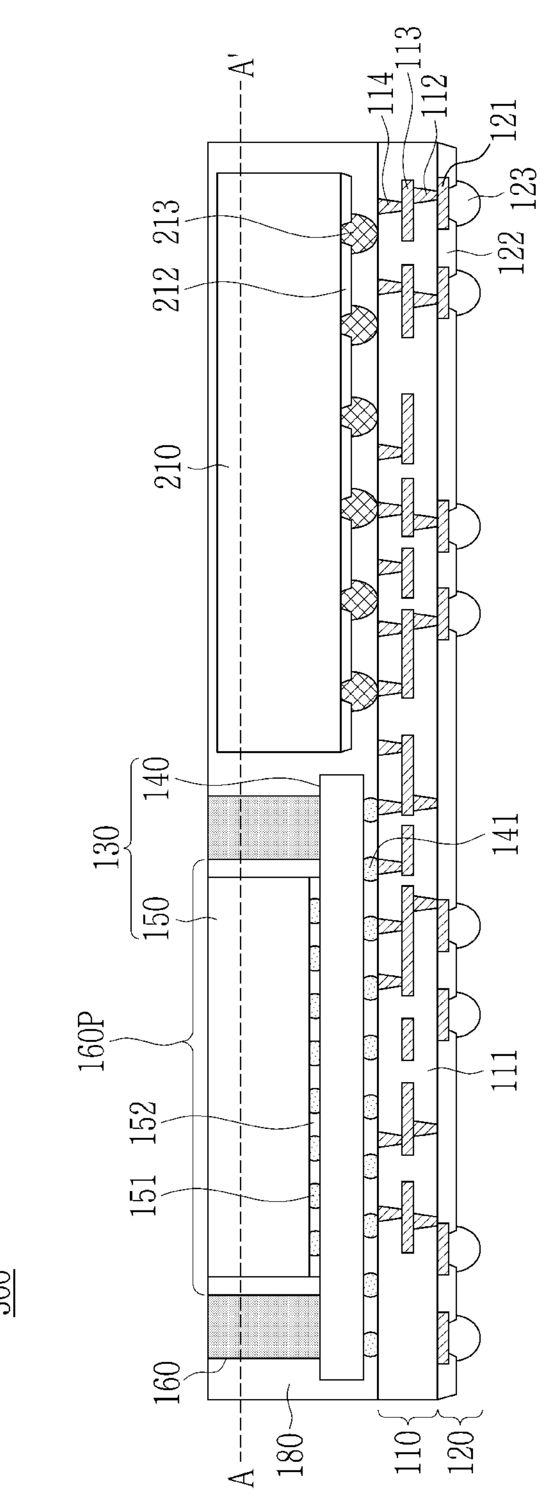
FIG. 16 is a cross-sectional view of an example embodiment showing a semiconductor package in which a plate-shaped heat dissipation structure including a through opening is disposed on a first semiconductor die of a three-dimensional integrated circuit structure, and a second semiconductor die of a three-dimensional integrated circuit structure is exposed.

FIG. 16 is a cross-sectional view showing the semiconductor package 300 in which the heat dissipation structure 160 having the plate shape including a through opening 160P is disposed on the first semiconductor die 140 of the three-dimensional integrated circuit (3D IC) structure 130, and the second semiconductor die 150 of the three-dimensional integrated circuit (3D IC) structure 130 is exposed. FIG. 16 is a cross-sectional view of a plan view of the semiconductor package 300 shown in FIG. 17 taken along line B-B'.

Referring to FIG. 16, the heat dissipation structure 160 having the plate shape including the through opening 160P may be disposed on the first semiconductor die 140. The side surface of the heat dissipation structure 160 may be surrounded by the molding material 180. The heat dissipation structure 160 may be disposed on the first semiconductor die 140 to dissipate heat generated from the first semiconductor die 140.

The bottom surface of the heat dissipation structure 160 may be in physical contact with the upper surface of the first semiconductor die 140, the upper surface of the heat dissipation structure 160 may be exposed. Accordingly, heat accumulated in the first semiconductor die 140 may be conducted to the bottom surface of the heat dissipation structure 160 in physical contact with the first semiconductor die 140, and via the heat dissipation structure 160, may be dissipated to the outside through the upper surface of the heat dissipation structure 160 exposed to the outside.

Features and configurations other than the plate shape of the heat dissipation structure 160 in FIG. 16 are the same as those described with respect to FIG. 14. Therefore, the contents described with respect to FIG. 14 may be equally applied to the features and configurations other than the plate shape of the heat dissipation structure 160 in FIG. 16.

Figure 17:
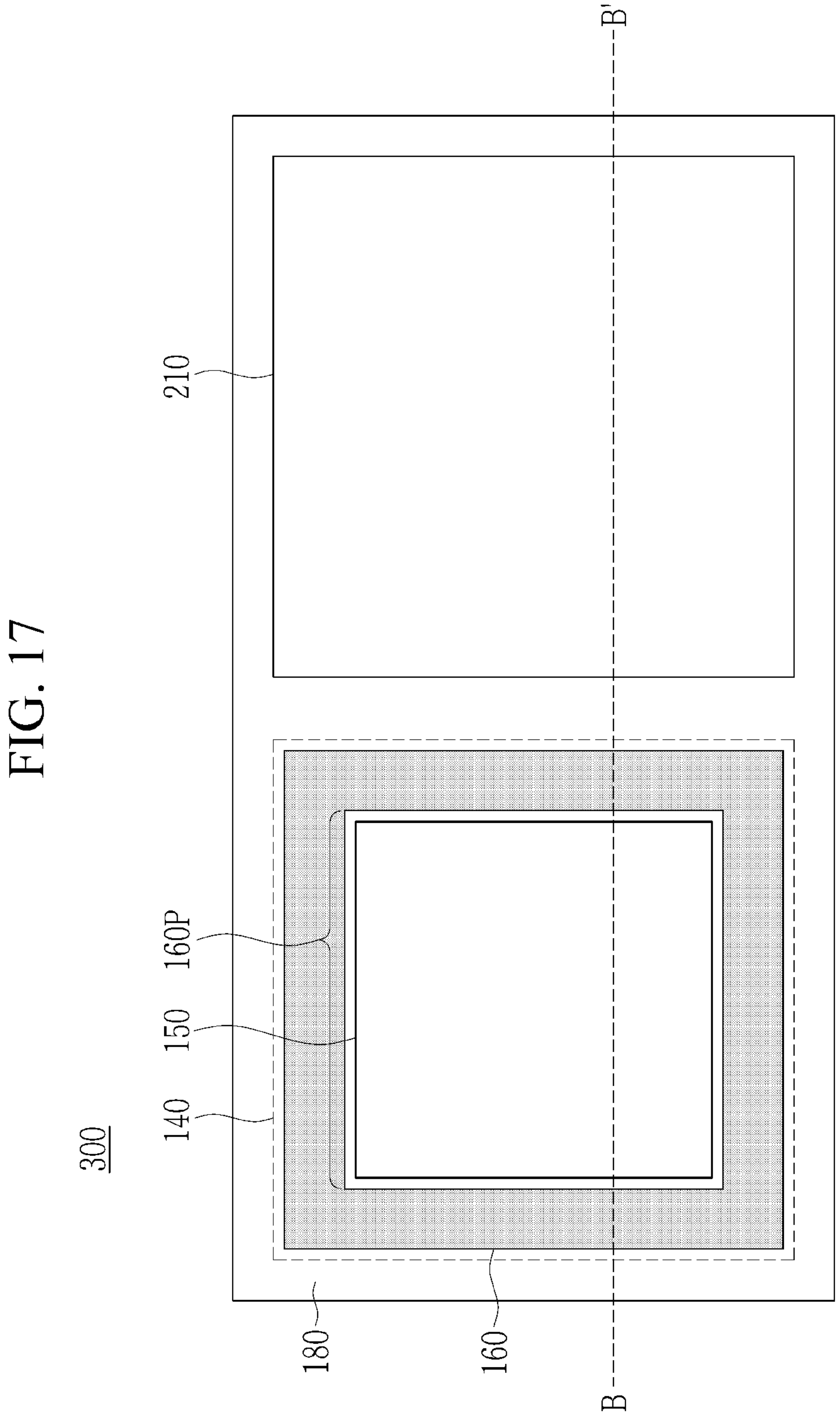
FIG. 17 is a top plan view of an example embodiment showing a semiconductor package in which a heat dissipation structure on a first semiconductor die, a second semiconductor die, and semiconductor structure are disposed within a molding material.

FIG. 17 is a top plan view showing the semiconductor package 300 in which the heat dissipation structure 160 on the first semiconductor die 140, the second semiconductor die 150, and the semiconductor structure 210 are disposed within the molding material 180. FIG. 17 is a top plan view of a cross-sectional view of the semiconductor package 300 shown in FIG. 16 taken along line A-A'.

Referring to FIG. 17, the first semiconductor die 140 is positioned lower than line A-A' of FIG. 16, and accordingly, an outline of the first semiconductor die 140 is indicated by a dotted line. The heat dissipation structure 160 may be disposed around the second semiconductor die 150 on the first semiconductor die 140. In an embodiment, the heat dissipation structure 160 may include the plate shape including the through opening 160P. The heat dissipation structures 160, the conductive posts 170 and the semiconductor structure 210 may be surrounded by the molding material 180.

A manufacturing method is illustrated in FIG. 18 through FIG. 27. Each of these figures (FIG. 18 through FIG. 27) is a cross-sectional view showing a method for manufacturing the semiconductor package 100 of FIG. 3. The semiconductor package of FIG. 1, FIG. 3, FIG. 6, FIG. 8, FIG. 10, FIG. 12, FIG. 14, and FIG. 16 differ from each other only in the shape of the heat dissipation structure 160 and whether the package method is the Package-on-Package (POP) or the side-by-side package, and accordingly, a method for manufacturing the semiconductor package 100 of FIG. 3 shown in and described with respect to FIG. 18 through FIG. 27 may be equally applied to a method for manufacturing the semiconductor package of FIG. 1, FIG. 6, FIG. 8, FIG. 10, FIG. 12, FIG. 14, and FIG. 16.

Figure 18:
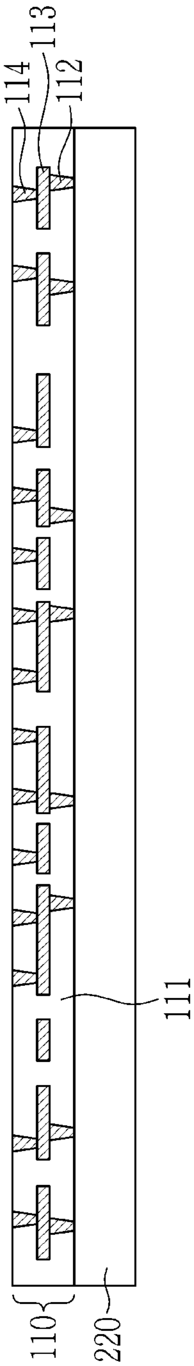
FIG. 18 is a cross-sectional view of an example embodiment showing forming a front side redistribution layer structure on a carrier, as one of processes of a method for manufacturing a semiconductor package.

FIG. 18 is cross-sectional view showing forming the front side redistribution layer structure 110 on a carrier 220, as one of processes of the method for manufacturing the semiconductor package 100.

Referring to FIG. 18, the front side redistribution layer structure 110 is formed on the carrier 220. The carrier 220 may include, for example, a silicon-based material such as glass or a silicon oxide, an organic material, or another material such as an aluminum oxide, a combination of these materials, and the like.

First, the first dielectric layer 111 is formed on the carrier 220. In an embodiment, the first dielectric layer 111 may include a photoactive polymer layer. The photoactive polymer is a material capable of forming fine patterns by applying a photolithography process. In an embodiment, the first dielectric layer 111 may include a photoimageable dielectric (PID) used in a redistribution layer process. In an embodiment, the photoimageable dielectric (PID) may include a polyimide-based photoactive polymer, a novolac-based photoactive polymer, polybenzoxazole, a silicon-based polymer, an acrylate-based polymer, or an epoxy-based polymer. In another embodiment, the first dielectric layer 111 is formed of an inorganic dielectric material such as a silicon nitride, a silicon oxide, and the like. In an embodiment, the first dielectric layer 111 may be formed by a CVD, ALD, or PECVD process.

After the first dielectric layer 111 is formed, via holes are formed by selectively etching the first dielectric layer 111, and the first redistribution vias 112 is formed by filling a conducting material into the via holes.

Then, the first dielectric layer 111 on the first redistribution vias 112 and the first dielectric layer 111 is additionally deposited, openings are formed by selectively etching the additionally deposited first dielectric layer 111, and the first redistribution lines 113 is formed by filling a conducting material into the openings.

Then, the first dielectric layer 111 is additionally deposited on the first redistribution lines 113 and the first dielectric layer 111, via holes are formed by selectively etching the additionally deposited first dielectric layer 111, and the second redistribution vias 114 is formed by filling a conducting material into the via holes.

In an embodiment, the first redistribution vias 112, the first redistribution lines 113 and the second redistribution vias 114 may include at least one of copper, aluminum, tungsten, nickel, gold, tin, titanium and an alloy thereof. In an embodiment, the first redistribution vias 112, the first redistribution lines 113 and the second redistribution vias 114 may be formed by performing a sputtering process. In another embodiment, the first redistribution vias 112, the first redistribution lines 113 and the second redistribution vias 114 may be formed by performing an electrolytic plating process after forming a seed metal layer.

Figure 19:
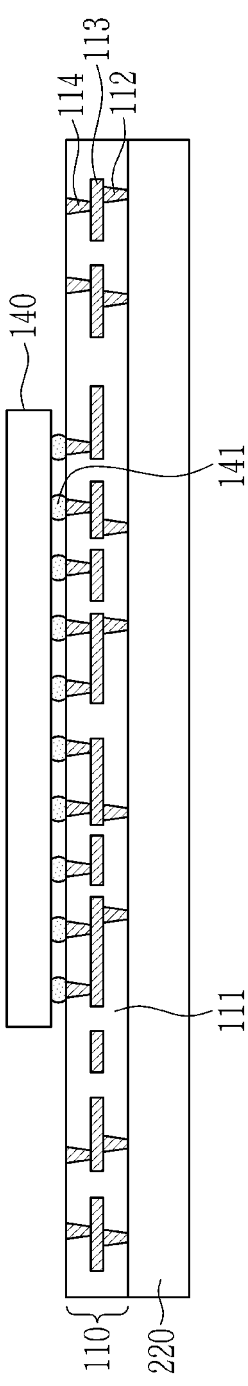
FIG. 19 is a cross-sectional view of an example embodiment showing mounting a first semiconductor die on a front side redistribution layer structure, as one of processes of a method for manufacturing a semiconductor package.

FIG. 19 is cross-sectional view showing mounting the first semiconductor die 140 on the front side redistribution layer structure 110, as one of processes of the method for manufacturing the semiconductor package 100.

Referring to FIG. 19, the first semiconductor die 140 is mounted on the front side redistribution layer structure 110. The connection member 141 of the first semiconductor die 140 is bonded to the second redistribution via 114 of the front side redistribution layer structure 110, and accordingly, the first semiconductor die 140 and the front side redistribution layer structure 110 are electrically connected. In an embodiment, the connection member 141 may include a micro-bump.

Figure 20:
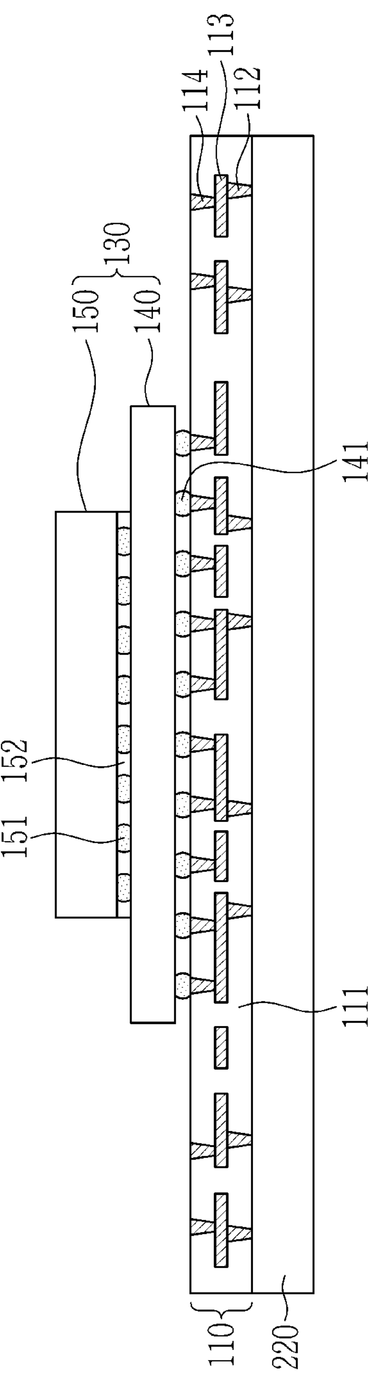
FIG. 20 is a cross-sectional view of an example embodiment showing mounting a second semiconductor die on a first semiconductor die, as one of processes of a method for manufacturing a semiconductor package.

FIG. 20 is cross-sectional view showing mounting the second semiconductor die 150 on the first semiconductor die 140, as one of processes of the method for manufacturing the semiconductor package 100.

Referring to FIG. 20, the second semiconductor die 150 is mounted on the first semiconductor die 140. The second semiconductor die 150 is bonded to the first semiconductor die 140 by connection members 151. In an embodiment, the connection member 151 may include a micro-bump.

The insulation member 152 is disposed between first semiconductor die 140 and the second semiconductor die 150, to surround the connection members 151. By dispose the insulation member 152 between first semiconductor die 140 and the second semiconductor die 150, stress that may be generated between the first semiconductor die 140 and the second semiconductor die 150 may be alleviated. In an embodiment, the insulation member 152 may include a non-conductive film (NCF). In an embodiment, the insulation member 152 may include a MUF (Molded Under-Fill).

Figure 21:
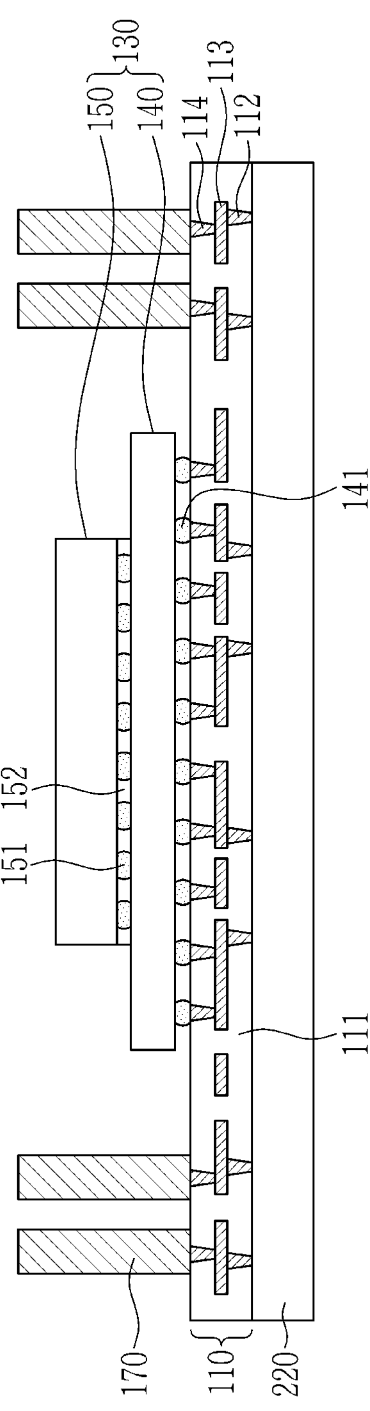
FIG. 21 is a cross-sectional view of an example embodiment showing forming conductive posts on a front side redistribution layer structure, as one of processes of a method for manufacturing a semiconductor package.
Figure 22:
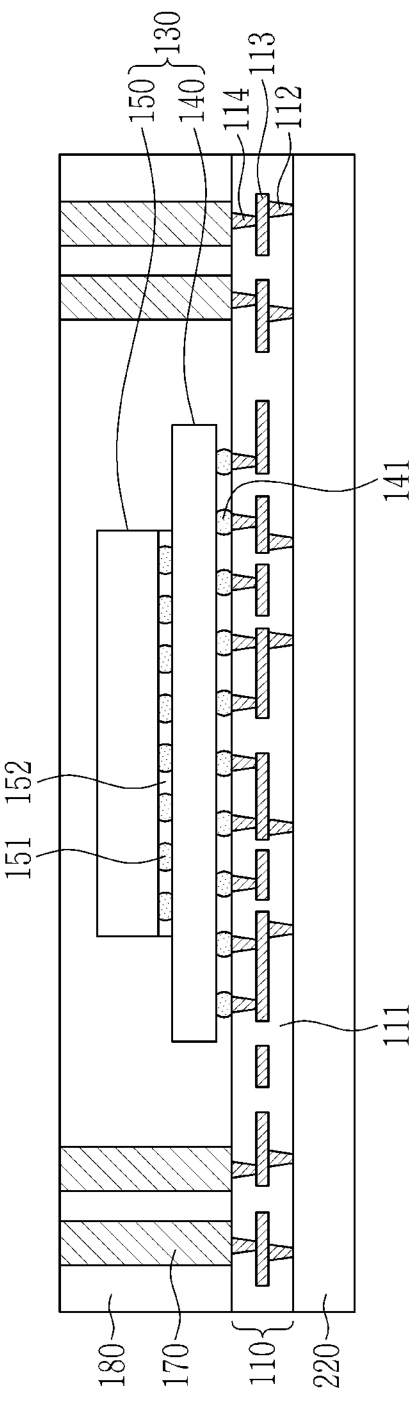
FIG. 22 is a cross-sectional view of an example embodiment showing molding a first semiconductor die, a second semiconductor die, and conductive posts on a front side redistribution layer structure, as one of processes of a method for manufacturing a semiconductor package.

FIG. 21 is cross-sectional view showing forming the conductive posts 170 on the front side redistribution layer structure 110, as one of processes of the method for manufacturing the semiconductor package 100.

Referring to FIG. 21, the conductive posts 170 are bonded on the front side redistribution layer structure 110 to be formed in the vertical direction. In an embodiment, the conductive posts 170 may be formed by performing a sputtering process. In another embodiment, the conductive posts 170 may be formed by performing an electrolytic plating process after forming a seed metal layer. In an embodiment, the conductive posts 170 may include at least one of copper, aluminum, tungsten, nickel, gold, silver, chromium, antimony, tin, titanium and an alloy thereof.

FIG. 18 is a cross-sectional view showing molding the first semiconductor die 140, the second semiconductor die 150, and the conductive posts 170 on the front side redistribution layer structure 110, as one of processes of the method for manufacturing the semiconductor package 100.

Referring to FIG. 18, the first semiconductor die 140, the second semiconductor die 150, a heat slug 160, and the conductive posts 170 are molded by the molding material 180 on the front side redistribution layer structure 110. In some embodiments, the process of molding with the molding material 180 may include a compression molding or transfer molding process. In an embodiment, the molding material 180 may include the second epoxy molding compound (EMC).

After the molding process, in order to equalize the level of the upper surface of the molding material 180, a chemical mechanical polishing (CMP) is performed to planarize the upper surface of the molding material 180.

Figure 23:
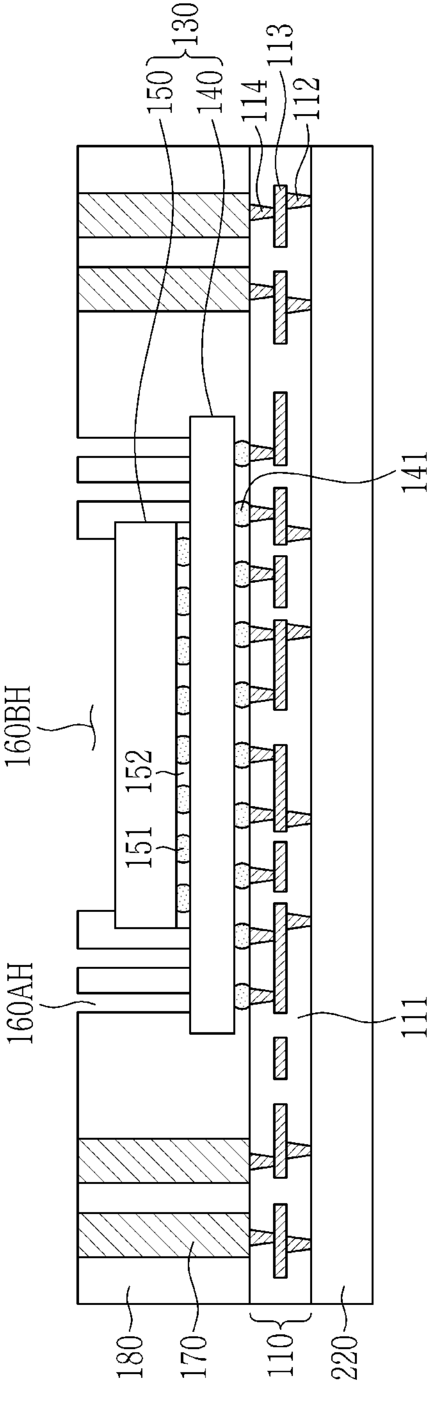
FIG. 23 is a cross-sectional view of an example embodiment showing forming openings for forming heat dissipation structures in a molding material, as one of processes of a method for manufacturing a semiconductor package.

FIG. 23 is cross-sectional view showing forming openings 160AH and 160BH for forming the heat dissipation structures 160 in the molding material 180, as one of processes of the method for manufacturing the semiconductor package 100.

Referring to FIG. 23, the openings 160AH and 160BH for forming the heat dissipation structures 160 in the molding material 180 are formed.

In an embodiment for forming the openings 160AH and 160BH, a photoresist may be used. First, the photoresist is coated on the molding material 180. In an embodiment, the photoresist may be formed through spin coating. In an embodiment, the photoresist may include an organic polymer resin including a photoactive material. Then, exposure and development is applied to the photoresist to form a pattern on the photoresist. Then, form the openings 160AH and 160BH by etching the molding material 180 using the photoresist pattern as an etching mask. Then, the photoresist pattern is removed from the molding material 180 by ashing and stripping.

As another embodiment for forming the openings 160AH and 160BH, laser or micro drilling may be used.

Figure 24:
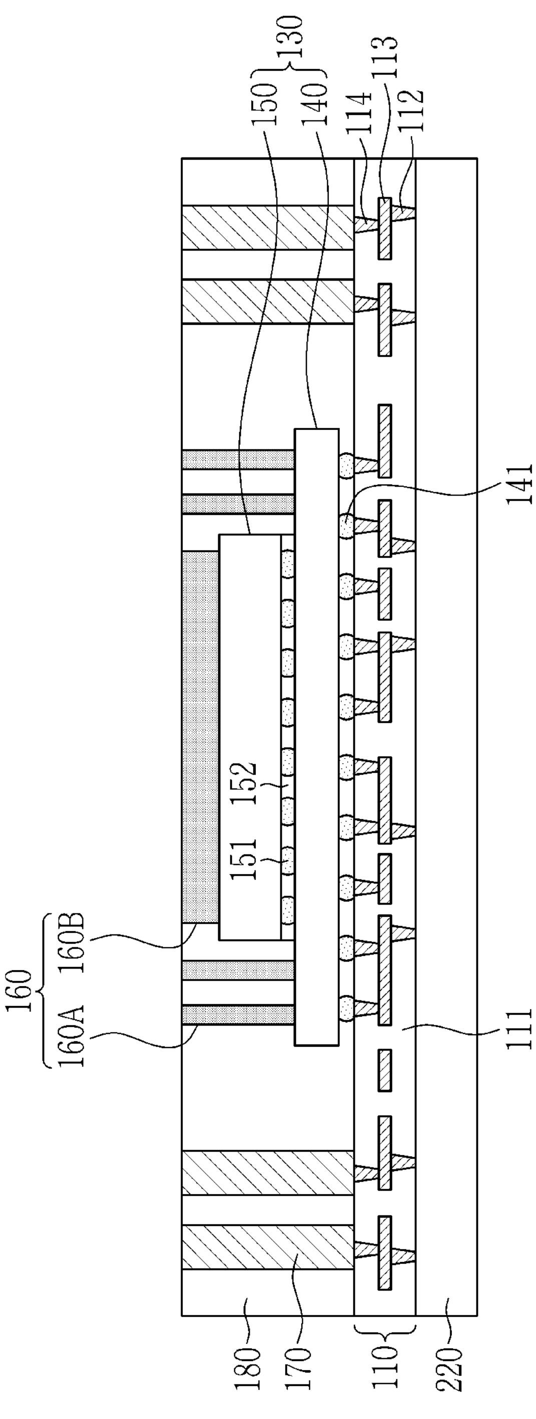
FIG. 24 is a cross-sectional view of an example embodiment showing forming heat dissipation structures by filling openings with a first epoxy molding compound (EMC), as one of processes of a method for manufacturing a semiconductor package.

FIG. 24 is a cross-sectional view showing forming the heat dissipation structures 160 by filling the openings 160AH and 160BH, as one of processes of the method for manufacturing the semiconductor package 100.

Referring to FIG. 24, the openings 160AH and 160BH within the molding material 180 is filled with the first epoxy molding compound (EMC) to form the heat dissipation structures 160. In an embodiment, the heat dissipation structures 160 is formed by compression molding or transfer molding process.

After the molding process, in order to equalize the level of the upper surface of the heat dissipation structures 160 and the upper surface of the molding material 180, a chemical mechanical polishing (CMP) is performed to planarize the heat dissipation structures 160 and the upper surface of the molding material 180.

Figure 25:
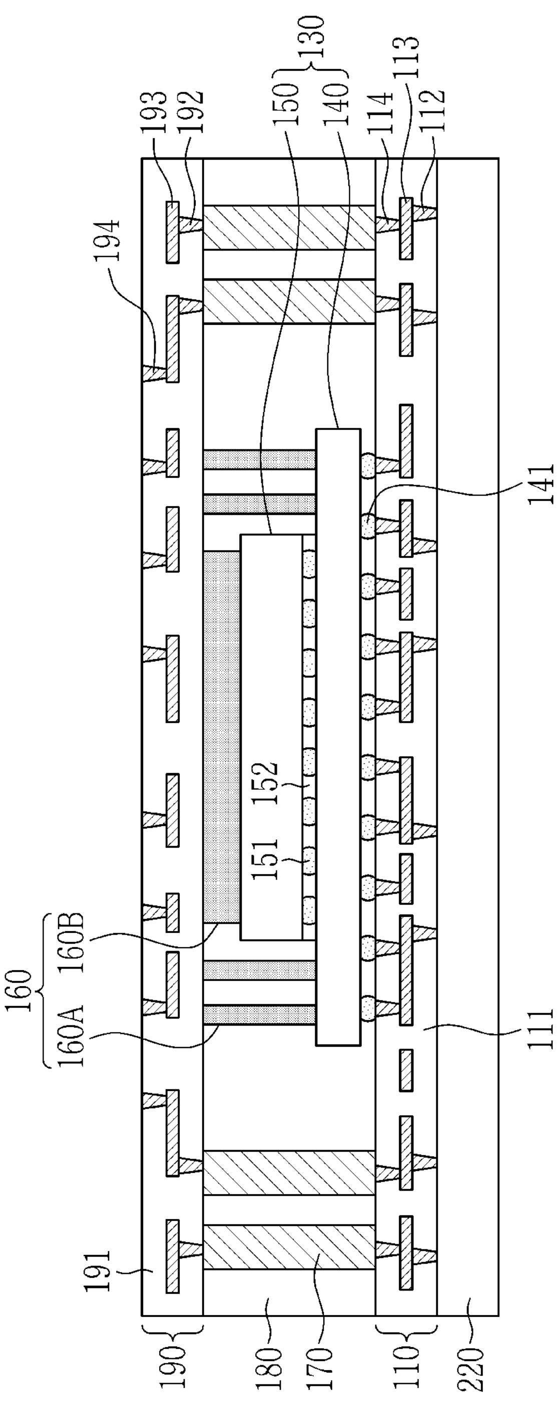
FIG. 25 is a cross-sectional view of an example embodiment showing forming a back side redistribution layer structure on first heat dissipation structures and second heat dissipation structures, conductive posts and a molding material, as one of processes of a method for manufacturing a semiconductor package.

FIG. 25 is a cross-sectional view showing forming the back side redistribution layer structure 190 on the first heat dissipation structures 160A and the second heat dissipation structure 160B, the conductive posts 170, and the molding material 180, as one of processes of the method for manufacturing the semiconductor package 100.

Referring to FIG. 25, the back side redistribution layer structure 190 is formed on the first heat dissipation structures 160A and the second heat dissipation structure 160B, the conductive posts 170 and the molding material 180.

First, the second the dielectric layer 191 is formed on the first heat dissipation structures 160A and the second heat dissipation structure 160B, the conductive posts 170 and the molding material 180. In an embodiment, the second the dielectric layer 191 may include a photoactive polymer layer. The photoactive polymer is a material capable of forming fine patterns by applying a photolithography process. In an embodiment, the second the dielectric layer 191 may include a photoimageable dielectric (PID) used in a redistribution layer process. In an embodiment, the photoimageable dielectric (PID) may include a polyimide-based photoactive polymer, a novolac-based photoactive polymer, polybenzoxazole, a silicon-based polymer, an acrylate-based polymer, or an epoxy-based polymer. In another embodiment, the second the dielectric layer 191 is formed of an inorganic dielectric material such as a silicon nitride, a silicon oxide, and the like In an embodiment, the second the dielectric layer 191 may be formed by a CVD, ALD, or PECVD process.

After the second the dielectric layer 191 is formed, via holes are formed by selectively etching the second the dielectric layer 191, and the third redistribution vias 192 is formed by filling a conducting material into the via holes.

Then, the second the dielectric layer 191 is additionally deposited on the third redistribution vias 192 and the second the dielectric layer 191, openings are formed by selectively etching the additionally deposit second the dielectric layer 191, and the second redistribution lines 193 is formed by filling a conducting material into the openings.

Then, the second the dielectric layer 191 is additionally deposited on the second redistribution lines 193 and the second the dielectric layer 191, via holes are formed by selectively etching the additionally deposit second the dielectric layer 191, and the fourth redistribution vias 194 is formed by filling a conducting material into the via holes.

In an embodiment, the third redistribution vias 192, the second redistribution lines 193 and the fourth redistribution vias 194 may include at least one of copper, aluminum, tungsten, nickel, gold, tin, titanium and an alloy thereof. In an embodiment, the third redistribution vias 192, the second redistribution lines 193 and the fourth redistribution vias 194 may be formed by performing a sputtering process. In another embodiment, the third redistribution vias 192, the second redistribution lines 193 and the fourth redistribution vias 194 may be formed by performing an electrolytic plating process after forming a seed metal layer.

Figure 26:
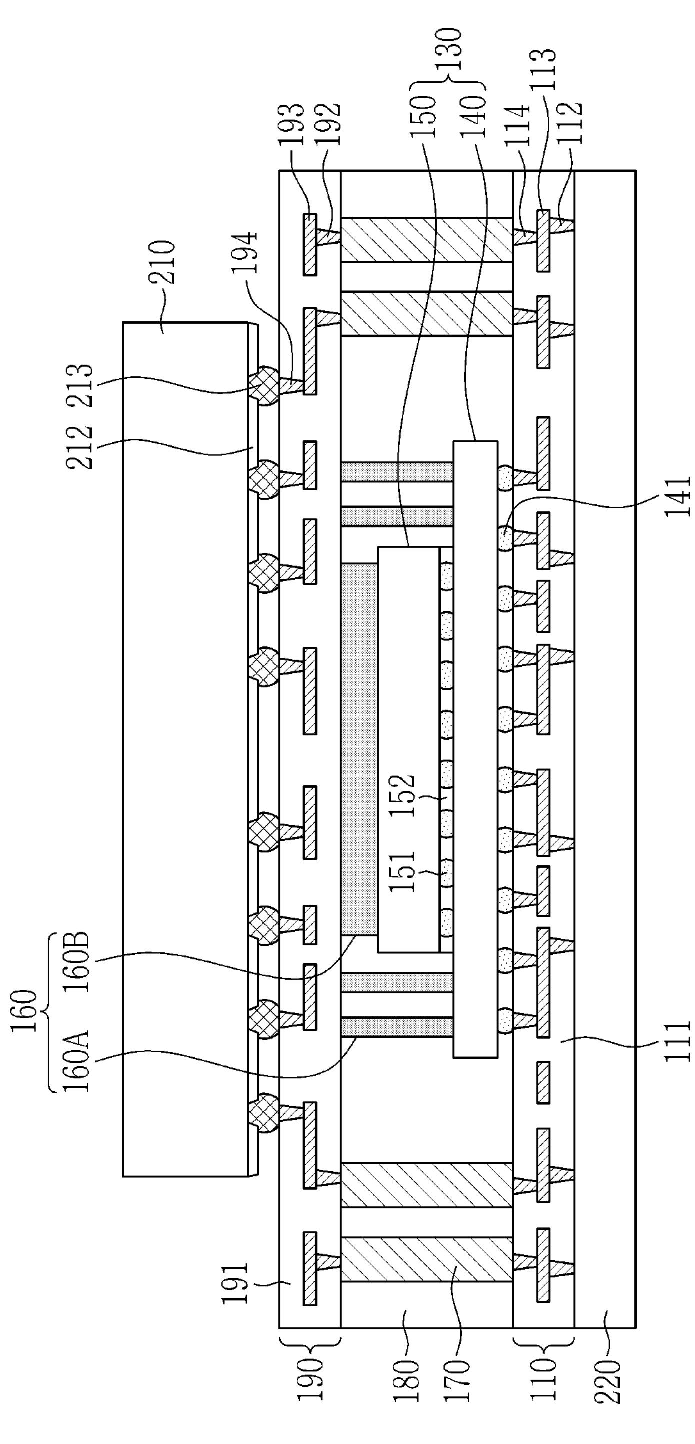
FIG. 26 is a cross-sectional view of an example embodiment showing mounting a semiconductor structure on a back side redistribution layer structure, as one of processes of a method for manufacturing a semiconductor package.

FIG. 26 is cross-sectional view showing mounting the semiconductor structure 210 on the back side redistribution layer structure 190, as one of processes of the method for manufacturing the semiconductor package 100.

Referring to FIG. 26, the semiconductor structure 210 is mounted on the back side redistribution layer structure 190. The connection member 213 of the semiconductor structure 210 is bonded to the fourth redistribution via 194 of the back side redistribution layer structure 190, and accordingly, the semiconductor structure 210 and the back side redistribution layer structure 190 are electrically connected. In an embodiment, the connection member 213 may include a micro-bump or solder ball.

Figure 27:
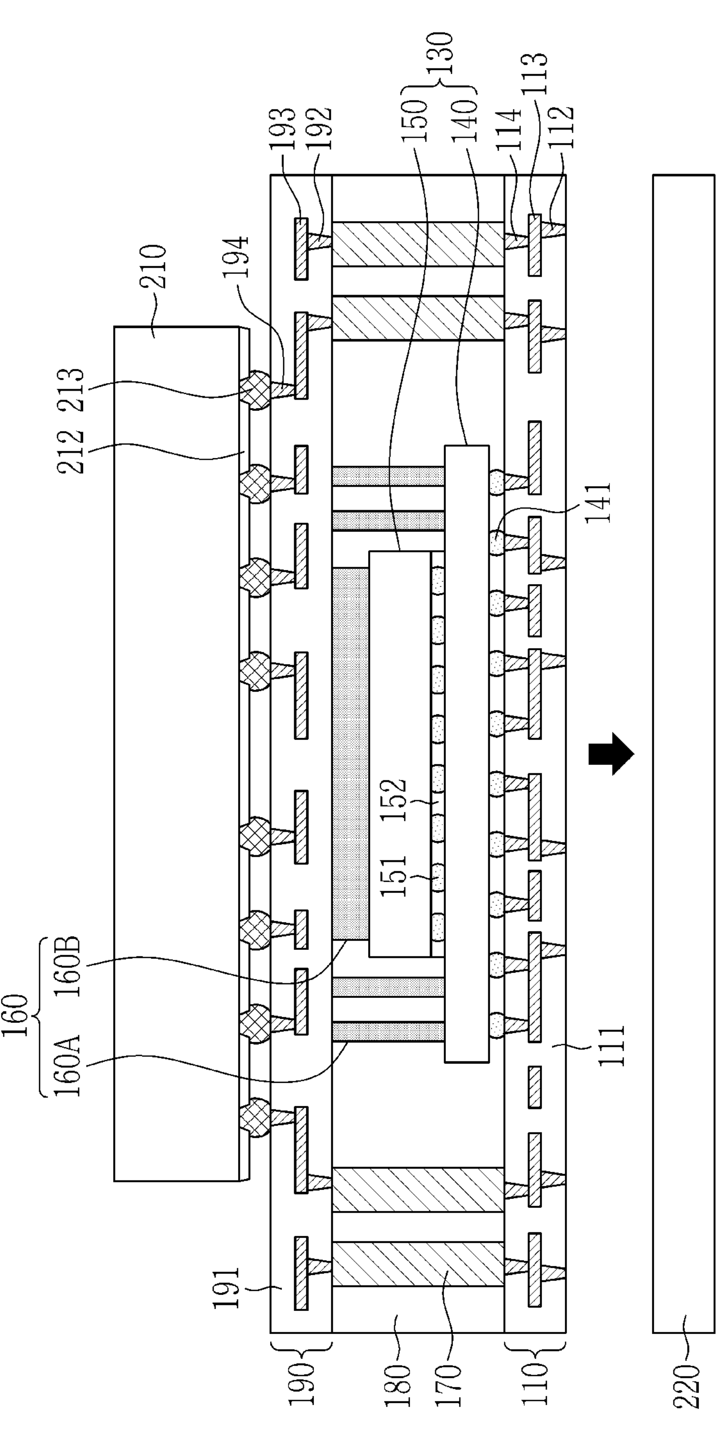
FIG. 27 is a cross-sectional view of an example embodiment showing de-bonding a carrier from a front side redistribution layer structure, as one of processes of a method for manufacturing a semiconductor package.

FIG. 27 is a cross-sectional view showing de-bonding the carrier 220 from the front side redistribution layer structure 110, as one of processes of the method for manufacturing the semiconductor package 100.

Referring to FIG. 27, the carrier 220 is de-bonded from the bottom surface of the front side redistribution layer structure 110.

Thereafter, the external connection structure 120 is form on the bottom surface of the front side redistribution layer structure 110.

The present application is not limited to the disclosed embodiments, but, on the contrary, is intended to cover various modifications and equivalent arrangements included within the spirit and scope of the appended claims.

What is claimed is:

1. A semiconductor package comprising:

a redistribution layer structure;

a semiconductor structure on the redistribution layer structure, the semiconductor structure comprising a first semiconductor die and a second semiconductor die on the first semiconductor die;

at least one heat dissipation structure on the first semiconductor die and around the second semiconductor die, wherein the at least one heat dissipation structure comprises a first epoxy molding compound; and a molding material on the redistribution layer structure and around the semiconductor structure and the at least one heat dissipation structure, wherein the molding material comprises a second epoxy molding compound, wherein a first thermal conductivity of the first epoxy molding compound is higher than a second thermal conductivity of the second epoxy molding compound.

2. The semiconductor package of claim 1, wherein the first epoxy molding compound comprises a metal filler.

3. The semiconductor package of claim 1, wherein the first epoxy molding compound comprises a ceramic filler.

4. The semiconductor package of claim 1, wherein the first epoxy molding compound comprises a carbon filler.

5. The semiconductor package of claim 1, wherein a first level of a first upper surface of each heat dissipation structure among the at least one heat dissipation structure and a second level of a second upper surface of the molding material are a same level.

6. The semiconductor package of claim 1, wherein, in a plan view, each heat dissipation structure among the at least one heat dissipation structure has a dot, elongated, elliptical, circular, or polygonal shape.

7. The semiconductor package of claim 1, wherein the at least one heat dissipation structure comprises heat dissipation structures spaced apart from each other at regular intervals.

8. The semiconductor package of claim 1, wherein:

at least one of the at least one heat dissipation structure comprises the first epoxy molding compound;

each of remaining heat dissipation structures among the at least one heat dissipation structure comprises an additional epoxy molding compound; and a third thermal conductivity of the additional epoxy molding compound is higher than the second thermal conductivity of the second epoxy molding compound.

9. The semiconductor package of claim 8, wherein the semiconductor structure comprises an asymmetric structure.

10. The semiconductor package of claim 1, wherein the semiconductor structure comprises a three-dimensional integrated circuit structure.

11. The semiconductor package of claim 10, wherein each heat dissipation structure among the at least one heat dissipation structure is on at least one of the first semiconductor die or the second semiconductor die.

12. The semiconductor package of claim 11, wherein a heat dissipation structure of the at least one heat dissipation structure on the first semiconductor die is disposed around the second semiconductor die.

13. The semiconductor package of claim 11, wherein a heat dissipation structure of the at least one heat dissipation structure on the first semiconductor die comprises a through opening, and the second semiconductor die is in the through opening.

14. The semiconductor package of claim 11, wherein, in a plan view, the heat dissipation structure disposed on the second semiconductor die has a shape obtained by scaling the shape of the second semiconductor die.

15. A semiconductor package comprising:

a redistribution layer structure;

a first semiconductor structure on the redistribution layer structure;

a second semiconductor structure side by side with the first semiconductor structure on the redistribution layer structure;

at least one heat dissipation structure on the first semiconductor structure and comprising a through opening therein, wherein the at least one heat dissipation structure comprises a first epoxy molding compound; and a molding material on the redistribution layer structure and around the first semiconductor structure, the second semiconductor structure, and the at least one heat dissipation structure, wherein the molding material comprises a second epoxy molding compound, wherein a first thermal conductivity of the first epoxy molding compound is higher than a second thermal conductivity of the second epoxy molding compound.

16. The semiconductor package of claim 15, wherein a side surface of each heat dissipation structure among the at least one heat dissipation structure is in contact with the first semiconductor structure, and another side surface is exposed to an outside.

17. A semiconductor package comprising:

a front side redistribution layer structure;

a first semiconductor structure on the front side redistribution layer structure, the first semiconductor structure comprising a first semiconductor die and a second semiconductor die on the first semiconductor die;

at least one heat dissipation structure on the first semiconductor die and around the second semiconductor die, wherein the at least one heat dissipation structure comprises a first epoxy molding compound;

a plurality of conductive posts electrically connected to the front side redistribution layer structure on the front side redistribution layer structure;

a molding material on the front side redistribution layer structure and around the first semiconductor structure, the at least one heat dissipation structure, and the plurality of conductive posts, wherein the molding material comprises a second epoxy molding compound;

a back side redistribution layer structure on the plurality of conductive posts and the molding material, and electrically connected to the plurality of conductive posts; and a second semiconductor structure on the back side redistribution layer structure, wherein a first thermal conductivity of the first epoxy molding compound is higher than a second thermal conductivity of the second epoxy molding compound.

18. The semiconductor package of claim 17, wherein a side surface of each heat dissipation structure among the at least one heat dissipation structure is in contact with the first semiconductor structure, and another side surface is in contact with the back side redistribution layer structure.

19. The semiconductor package of claim 17, wherein the first semiconductor structure comprises a system-on-chip (SOC).

20. The semiconductor package of claim 17, wherein the second semiconductor structure comprises a DRAM or high bandwidth memory semiconductor (HBM).

* * * * *